United States Patent
Green et al.

(10) Patent No.: US 10,033,374 B2
(45) Date of Patent: Jul. 24, 2018

(54) DEVICES WITH SIGNAL AND TEMPERATURE CHARACTERISTIC DEPENDENT CONTROL CIRCUITRY AND METHODS OF OPERATION THEREFOR

(71) Applicant: NXP USA, Inc., Austin, TX (US)

(72) Inventors: Bruce M. Green, Gilbert, AZ (US);
Enver Krvavac, Kildeer, IL (US);
Joseph Staudinger, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/601,567

(22) Filed: May 22, 2017

(65) Prior Publication Data

US 2017/0257091 A1    Sep. 7, 2017

Related U.S. Application Data

(60) Continuation of application No. 15/229,312, filed on Aug. 5, 2016, now Pat. No. 9,660,641, which is a
(Continued)

(51) Int. Cl.
*H03K 17/16* (2006.01)
*G06F 1/32* (2006.01)

(52) U.S. Cl.
CPC ......... *H03K 17/165* (2013.01); *G06F 1/3206* (2013.01); *H03K 17/162* (2013.01)

(58) Field of Classification Search
CPC ... H03K 17/165; H03K 17/162; G06F 1/3206
See application file for complete search history.

(56) References Cited

U.S. PATENT DOCUMENTS

| | | |
|---|---|---|
| 4,661,789 A | 4/1987 | Rauscher |
| 5,712,593 A | 1/1998 | Buer et al. |

(Continued)

FOREIGN PATENT DOCUMENTS

WO    2010007475 A1    1/2010

OTHER PUBLICATIONS

Heijningen, M., et al., "VSWR-Protected 90 W L-band AlGaN/GaN Power Amplifier", Microwave Symposium (IMS), 2014 IEEE MTT-S International, Jun. 1-6, 2014, Tampa, FL, pp. 1-3.
(Continued)

*Primary Examiner* — Kenneth B Wells
(74) *Attorney, Agent, or Firm* — Bruce M. Green

(57) ABSTRACT

An embodiment of a device includes a terminal, an active transistor die electrically coupled to the terminal, a detector configured to sense a signal characteristic on the terminal, and control circuitry electrically coupled to the active transistor die and to the detector, wherein the active transistor die, detector, and control circuitry are coupled to a package. The control circuitry may include a control element and a control device. Based on the signal characteristic, the control circuitry controls which of multiple operating states the device operates. A method for controlling the operating state of the device includes sensing, using the detector, a signal characteristic at the terminal, and determining, using the control device, whether the signal characteristic conforms to a pre-set criteria, and when the signal characteristic does not conform to the pre-set criteria, modifying the state of the control element to alter the operating state of the device.

23 Claims, 11 Drawing Sheets

Related U.S. Application Data division of application No. 14/314,071, filed on Jun. 25, 2014, now Pat. No. 9,438,224.

(56) References Cited

U.S. PATENT DOCUMENTS

| | | | |
|---|---|---|---|
| 6,051,933 A * | 4/2000 | Aiello | H03K 17/08126 |
| | | | 315/209 R |
| 6,078,222 A | 6/2000 | Harris et al. | |
| 6,700,428 B2 * | 3/2004 | Sander | H03K 17/0822 |
| | | | 327/312 |
| 6,990,323 B2 | 1/2006 | Prikhodko et al. | |
| 7,454,179 B1 | 11/2008 | Lee | |
| 7,512,386 B2 | 3/2009 | Kalajo et al. | |
| 7,570,931 B2 | 8/2009 | McCallister et al. | |
| 7,869,773 B2 | 1/2011 | Kuijken | |
| 8,254,860 B2 | 8/2012 | Boos | |
| 8,494,470 B2 | 7/2013 | Khoini et al. | |
| 8,624,675 B2 | 1/2014 | Lautzenhiser | |
| 8,659,358 B2 | 2/2014 | Masuda et al. | |
| 8,731,492 B2 | 5/2014 | Huot et al. | |
| 9,014,571 B2 | 4/2015 | Khalouf et al. | |
| 9,438,224 B2 | 9/2016 | Green et al. | |
| 2011/0221388 A1 | 9/2011 | Low et al. | |
| 2012/0309290 A1 | 12/2012 | Simmons et al. | |

OTHER PUBLICATIONS

Infineon, Infineon Bulk Acoustic Wave (BAW) Filters, Product Brief B132-H8251-G4-X-7600, Published by Infineon Technologies AG, www.infineon.com/baw, 2007, pp. 1-2.

Freescale Semiconductor, KL02 Sub-Family Data Sheet, Document No. KL02P20M48SF0, Rev. 2.1, Jul. 2013, pp. 1-41.

Skyworks, SKY33106-360LF: BAW Band Pass Filter 2.4 GHz, Data Sheet, Nov. 6, 2008, pp. 1-6.

Triquint Semiconductor, 885033, 2.4GHz WLAN/BT LTE Co-Existence Filter, Advanced Data Sheet: Rev B, Jan. 11, 2013, p. 1.

* cited by examiner

DEVICES WITH SIGNAL AND TEMPERATURE CHARACTERISTIC DEPENDENT CONTROL CIRCUITRY AND METHODS OF OPERATION THEREFOR

RELATED APPLICATION

This application is a continuation of U.S. patent application Ser. No. 15/229,312, filed on Aug. 5, 2016, now U.S. Pat. No. 9,660,641 which is a divisional of U.S. patent application Ser. No. 14/314,071, filed on Jun. 25, 2014, now U.S. Pat. No. 9,438,224.

TECHNICAL FIELD

Embodiments of the subject matter described herein relate generally to devices with signal characteristic dependent control circuitry and methods of operating such devices.

BACKGROUND

Microwave power amplifiers operate with ever increasing constraints on the amount of power that they may emit at frequencies outside the band of interest. For example, it may be desirable to limit the amount of power that a microwave power amplifier is able to emit in a certain frequency band outside the frequency of operation. Power emitted within the band of interest may be referred to as "in-band power," while power outside the frequency of operation may be referred to as "out-of-band power." In some applications, control of out-of-band power may be desired to prevent interference between adjacent communication channels. In other applications, control of out-of-band power may be useful in situations where, through either damage to an amplifier or excursions in manufacturing, a microwave transistor amplifier becomes unstable and oscillates, producing high levels of out-of-band power.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

As will be described below, and for various applications, embodiments of the inventive subject matter are configured to control the out-of-band power at the transistor device level. Furthermore, embodiments of the inventive subject matter may control the amount of out-of-band power while not affecting the in-band power capability of the transistor. As used herein, the term "power" may refer to peak power or average power. Peak power refers to the maximum instantaneous power in a signal while average power refers to the root-mean-square (RMS) power contained in a signal.

Figure 1:
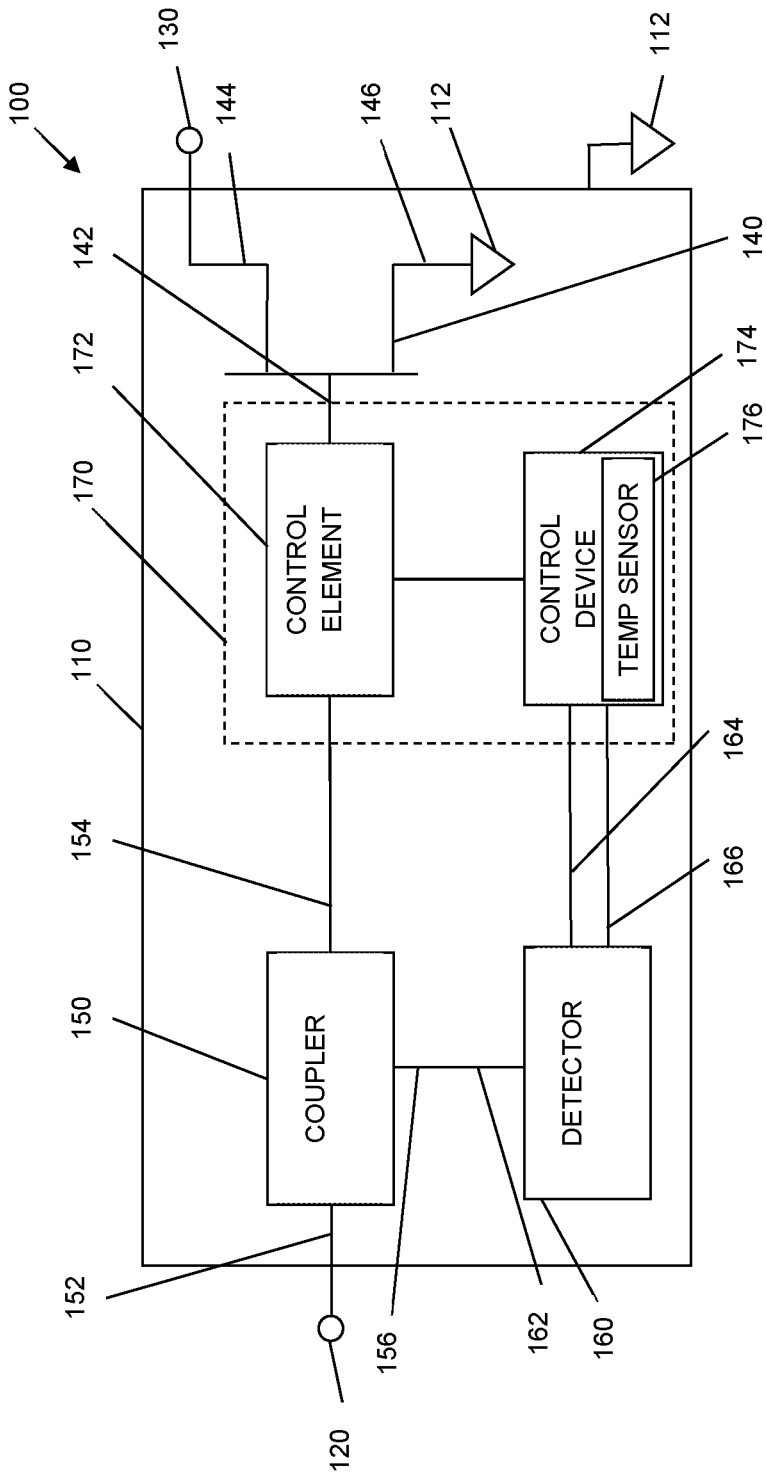
FIG. 1 illustrates a block diagram for a microwave transistor device, in accordance with an example embodiment.

FIG. 1 illustrates a simplified schematic block diagram for a microwave transistor device 100, in accordance with an example embodiment. In an embodiment, microwave transistor device 100 is designed to amplify in-band power according to its specifications while restricting the amount of out-of-band output power when a threshold is met for a maximum allowable out-of-band power level or other signal characteristic is reached.

In an embodiment, a microwave transistor device 100 includes a package 110 with an input terminal 120 and an output terminal 130. Package 110 houses an active transistor die 140, a coupler 150, a detector 160, and control circuitry 170. In an embodiment, active transistor die 140 is electrically coupled to at least one of input terminal 120 and output terminal 130. In an embodiment, coupler 150 is electrically coupled to input terminal 120 and control circuitry 170. Detector 160 is electrically coupled to coupler 150 and control circuitry 170, according to an embodiment.

In an embodiment, transistor package 110 includes a radio frequency (RF) package. As will be described in more detail in connection with its physical implementation 1210 of FIG. 12, package 110 houses and is coupled to active transistor die 140, coupler 150, detector 160, and control circuitry 170. In an embodiment, input terminal 120 and output terminal 130 provide electrical connections between microwave transistor device 100 and an input power source and an output load (not shown). The case of package 110 has a reference voltage potential 112 (e.g., ground or other suitable potential) while input terminal 120 takes on an instantaneous potential imposed by an input signal (not shown). Likewise, output terminal 130 takes on a potential that is an amplified version of the input signal at input terminal 120, according to the embodiment. In an embodiment, the case of package 110 is electrically coupled to circuit ground connections of one or more of active transistor die 140, coupler 150, detector 160, and control circuitry 170. In other embodiments, one or more of active transistor die 140, coupler 150, detector 160, and control circuitry 170 are electrically isolated from or are at another potential other than reference voltage potential 112 of the case of package 110.

In an embodiment, active transistor die 140 is physically coupled to package 110 and electrically coupled to the control circuitry 170 and output terminal 130. In an embodiment, active transistor die 140 includes a gate terminal 142, a drain terminal 144, and a source terminal 146. In an embodiment, package 110 and source terminal 146 are at reference voltage potential 112. In other embodiments, source terminal 146 may be at other suitable potentials, depending on the specific design. In an embodiment, gate terminal 142 and drain terminal 144 of active transistor die 140 may be electrically coupled to one or more impedance matching structure(s) (not shown) to transform the impedance presented by gate terminal 142 and drain terminal 144 to other impedances. In an embodiment, these transformed impedances allow input terminal 120 and output terminal 130 to be conveniently matched to other circuitry coupled to microwave transistor device 100 external to package 110.

According to an embodiment, active transistor die 140 includes at least one gallium nitride (GaN) layer and a silicon carbide (SiC) substrate (not shown). In an embodiment, active transistor die 140 includes a heterojunction between suitable group-III nitride materials including GaN, aluminum nitride (AlN), indium nitride (InN), and/or mixed crystal combinations of these materials. Such mixed crystals may include aluminum gallium nitride (AlGaN), indium aluminum gallium nitride (InAlGaN), and indium aluminum nitride (InAlN). In other embodiments, active transistor die 140 may include active layers that include one or more of GaN, AlGaN, InN, InAlN, InGaAlN, gallium arsenide (GaAs), aluminum arsenide (AlAs), gallium phosphide (GaP), SiC, silicon (Si), germanium (Ge), indium phosphide (InP), indium antimonide (InSb), graphene, a combination of these, or other suitable materials. In still other embodiments, active transistor die 140 may include substrate layers that include one of GaN, AlGaN, InN, InAlN, InGaAlN, GaAs, AlAs, SiC, Si, Ge, InP, InSb, GaP, a combination of these, or other suitable materials. In an embodiment, transistor technologies used to realize active transistor die 140 may include one of field effect transistors (FET's), metal-oxide field effect transistors (MOSFET's), metal-semiconductor field effect transistors (MESFET's), insulated gate FET's (IGFET's), laterally diffused metal oxide semiconductor (LDMOS) field effect transistors, high electron mobility transistors (HEMT's), heterojunction bipolar transistors (HBT's), bipolar junction transistors (BJT's), a combination of these, or other suitable technologie(s).

In an embodiment, coupler 150 is physically coupled to package 110 and electrically coupled to control element 172 and to detector 160. Coupler 150 includes an input port 152, an output port 154, and a coupled port 156. In an embodiment, coupler 150 diverts a small amount of signal power from input terminal 120 that is present at input port 152 to coupled port 156. In an embodiment, coupler 150 allows the vast majority of the signal power presented to input port 152 to pass through to output port 154 to feed the primary signal path of the transistor. As used herein, "primary signal path" of the transistor refers to the signal path from input terminal 120 through coupler 150, control element 172, active transistor die 140, and output terminal 130. Likewise, as used herein, a "primary path signal" refers to a signal that propagates along the primary signal path as defined. In an embodiment, coupler 150 includes a series connected capacitor (not illustrated) between input port 152 and coupled port 156. In an embodiment, input port 152 and output port 154 are at the same electrical potential. In an embodiment, the value for the capacitor that electrically couples input port 152 and coupled port 156 is chosen so that its impedance at the frequency of operation is sufficiently high so as not to significantly burden the microwave current that passes from input port 152 to output port 154. In an embodiment, the capacitance value is chosen to be at least ten times higher than the terminal impedance, defined by the ratio of the RMS voltage and RMS current seen at input terminal 120 at the frequency of operation. Without departing from the scope of the invention, the capacitor may have a value that presents impedances higher or lower than a factor of 10 times higher than the terminal impedance of input terminal 120, depending on the sensitivity and power handling capability of detector 160. In other embodiments, coupler 150 may include one of directional couplers, hybrid couplers, coupled line filters, or other suitable coupling devices. Whichever coupling device is chosen couples a relatively small amount of the power present in the input signal at input terminal 120 to coupled port 156. Output port 154 is electrically coupled to control element 172 of control circuitry 170, according to an embodiment.

In an embodiment, detector 160 is physically coupled to package 110 and electrically coupled to coupler 150 and control circuitry 170. According to an embodiment, detector 160 receives a portion of the input signal that is applied to input terminal 120 from coupled port 156 of coupler 150. According to an embodiment, and as will be described with more detail in connection with FIG. 2, detector 160 includes a detector input port 162, extra-band power port 164, and in-band power port 166. According to an embodiment, detector 160 processes the signal coupled from coupled port 156 of coupler 150 into input port 162 and converts the radio frequency (RF) signal into an averaged signal at extra-band power port 164 with a voltage proportional to the power level of the signal in an in-band frequency range plus an out-of-band frequency range (collectively referred to as an "extra-band" frequency range). Likewise, in-band power port 166 produces an averaged signal having a voltage proportional to the power level of the signal for the in-band frequency range. As will be described in more detail below, the voltage levels of the averaged at extra-band power port 164 and in-band power port 166 may be used to ascertain or estimate the output power levels at output terminal 130 in extra-band frequency range and in the in-band frequency range, respectively. The averaged signals that appear at extra-band power port 164 and in-band power port 166 may vary at a rate that depends on the design of detector 160. In some embodiments, the averaged signals may vary at a rate on the order of the baseband signal that underlies the primary path signals. In this case, the averaged signals would give a reading of the instantaneous peak envelope power. In other embodiments, the averaged signal may be quasi-DC, varying at a rate of fractions of seconds to seconds, giving a reading of the average power on the order of seconds. Extra-band and in-band power ports 164 and 166 are coupled to control device 174 of control circuitry 170 according to an embodiment.

As an example of the operation of detector 160, and as will be described in more detail below, the in-band frequency range may be between 1.99 gigahertz (GHz) and 2.01 GHz. The extra band frequency range may be defined by the frequency response of coupler 150 and may be between 0.1 GHz and 4 GHz. Detector 160 provides an averaged signal at in-band power port 166 that has a voltage that is proportional to the total power contained between 1.99 and 2.01 GHz, according to this example embodiment.

An averaged signal at extra band power port has a voltage that is proportional to the total power contained between 0.1 and 4 GHz. As will be described below, the out-of band power (e.g. at all frequencies excluding 1.99-2.01 GHz) may be estimated by control device 174 by subtracting the in-band power (includes only power from 1.99 to 2.01 GHz) from the extra band power (includes power from 0.1 to 4 GHz). In other embodiments, and as will be described in more detail in FIG. 8 and in connection with an alternate embodiment 800 of detector 160, detector 160 may also be configured to sense power in one or more frequency range(s) below the in-band power (e.g. "below-band power" below 1.99 GHz) and in one or more frequency range(s) above the in-band power (e.g. above-band power above 2.01 GHz). Without departing from the scope of the inventive subject matter, detector 160 may also be configured to sense power in more than one in-band frequency ranges (e.g. 1.99-2.01 GHz and 2.99-3.01 GHz) and power in the corresponding out-of-band frequency ranges (e.g. 0.01-1.99 GHz, 2.01-2.99 GHz and 3.01-4.0 GHz). In these embodiments, the in-band and out-of band powers would be determined analogously to the above discussion by taking the difference between the in-band and extra frequency band power. It should be appreciated that the frequency ranges given in this example are merely illustrative and that other frequency range(s) may be used in other embodiments of the inventive subject matter.

In an embodiment, control circuitry 170 is physically coupled to package 110 and electrically coupled to coupler 150 and active transistor die 140. In an embodiment, control circuitry 170 includes a control element 172 and a control device 174. In an embodiment, control device 174 is configured to acquire a signal characteristic (e.g. power, peak power, phase, noise, or other relevant signal characteristic) from the detector, and based on the signal characteristic, to cause the control element to control in which of the multiple operating states (e.g. a "nominal operating state" or a "controlled operating state" as described in FIGS. 6 and 7 below) the device operates. In an embodiment, control element 172, described more fully in conjunction with the description of FIGS. 3-5, receives the primary path signal from coupler 150 and drives gate terminal 142 of active transistor die 140 with the primary path signal. The power level of primary path signal seen at gate terminal 142 is determined by the gain of control element 172. The gain of control element 172 is set by control device 174 in response to measurements of the instantaneous voltages of the averaged signals seen at the extra-band and in-band power ports 164 and 166 of detector 160. In an embodiment, control element 172 is configured to reduce the gain of microwave transistor device 100 to a level that should ensure that a maximum allowable out-of-band power level cannot be reached if control device 174 does not provide a signal that enables control element 172.

In an embodiment, control device 174 includes a microcontroller unit (MCU). In an embodiment, where control device 174 is implemented as an MCU, the MCU may include an integrated circuit containing a processor core, memory, one or more analog to digital converter(s) (ADC's), and other programmable input/output peripherals. The ADC's within the MCU embodiment of control device 174 receive the averaged signals provided on extra-band and in-band power ports 164 and 166. The ADC's within control device 174 sample the voltage levels of the signals on the extra-band and in-band power ports 164 and 166 at a sample rate of between about 1 sample per second and about $10^6$ samples per second, although other higher or lower sample rates may be used, according to an embodiment. In addition, the processor continuously calculates running average voltage values for each of the signals on extra-band and in-band power ports 164 and 166. Each running average voltage may span a pre-determined time interval (e.g., a sliding window of time) or a pre-determined number of most recent samples. These calculations result in an average extra-band reading and an average in-band reading, both of which are continuously updated.

In an embodiment, the digital representation of voltage samples produced by the ADC's of the MCU of control device 174 are converted to estimates of the power levels within the out-of-band frequency range(s) and in-band frequency range in the primary path signal at output terminal 130. In an embodiment, control device 174 first estimates the power levels at input terminal 120 in the in-band and extra-band frequency range(s) using coupling coefficients that represent the ratio of power levels in the primary path signal to that of the coupled signal that is read by detector 160. In an embodiment, the MCU of control device 174 uses the estimates of the power levels at input terminal 120 in the extra-band and in-band frequency ranges to estimate the out-of-band and in-band power levels at output terminal 130. An estimate of the out-of-band output power at output terminal 130 may be arrived at by subtracting the in-band power level from the extra-band power level at output terminal 130. In an embodiment, the extra-band and in-band power level estimates at output terminal 130 are determined using a look-up table that correlates the radio frequency transducer gain ($G_T$) of the primary signal path (e.g., including a sum of the gain (in decibels (dB)) of active transistor die 140, the gain of control element 172 (referred to as $G_{CE}$), the gain of coupler 150, and the gain(s) of any intervening components not shown (e.g., impedance matching networks and/or other gain stage(s) (not shown))) with various input power levels. The input power levels may be expressed in decibels above one milliwatt (dBm), and $G_T$ may be expressed in dB, for example. In an embodiment, the look-up table of input power-dependent values of $G_T$ is stored in the memory of the MCU. In an embodiment, for both the out-of-band and in-band estimates, the estimated power levels (at input 120) of the primary path signal is multiplied by (or added to in the dBm domain) the input power-dependent value of $G_T$ for the look-up table entry that has a power level that is closest to the estimate. These calculations result in estimates of the power levels of output signal 130 in the out-of-band frequency range and the in-band frequency range. In an embodiment, control device 174 calculates running averages of the estimated power levels at output 130 in the in-band and out-of-band frequency ranges over a pre-determined time interval (or pre-determined number of samples).

Based on the running average estimated values of power levels at output 130 in the out-of-band and in-band frequency ranges, control device 174 sends control signals to the control element 172. In an embodiment, the control signals may be used to change the gain of the control element 172, $G_{CE}$, to bring the estimated output power level in the out-of-band and/or in-band frequency ranges to or below a pre-defined level. In some embodiments where control element 172 is implemented as a radio frequency switch, as described in FIG. 4 herein, the control signals may be used to substantially alter the power delivered to the gate 142 of active transistor die 140 from input terminal 120, thus either effectively disabling microwave transistor device 100 (i.e., putting transistor device 100 in an "off" condition) or lowering the gain to a level that may ensure that the out-of-band power will stay below a certain pre-defined level (i.e., putting transistor device 100 in a reduced power level or "controlled" operating state). In an embodiment, the period of time for which the transistor device 100 operates at a reduced power level or in an "off" condition (i.e., the transistor device is in a controlled operating state) may be a pre-determined time interval. In an embodiment, the pre-determined time interval in the altered operational state may be between about 1 millisecond and about 100 seconds though other shorter or longer time intervals may be used. In other embodiments, the control device 174 may render transistor device 100 in an altered operational state until a code is entered into control device 174 through an external terminal or other electrical connection to control device 174 (not shown).

Without departing from the scope of the inventive subject matter, in an embodiment, control device 174 implemented as an MCU may include a temperature sensor 176 that detects a temperature of the transistor device 100 (e.g., a temperature of package 110 in the region where package 110 couples to control device 174 and to active transistor die 140). According to an embodiment, the temperature estimate may be used to estimate the temperature of active transistor die 140. More specifically, in an embodiment, the junction temperature of active transistor die 140 may be determined using the temperature estimate, the thermal resistance of the active die, and the estimate of the output power level obtained from the input power and $G_T$. According to an embodiment, the power-dependent $G_T$ may also be adjusted based on the estimated junction temperature of active transistor die 140. In an embodiment, control device 174 may be used to adjust the $G_{CE}$ of control element 172 to maintain a constant or specified $G_T$ independent of output power at output terminal 130 or device temperature. For example, $G_{CE}$, of control element 172 may be increased for relatively high junction temperatures and/or decreased for relatively low junction temperatures. A look-up table that correlates junction temperature (or device temperature) and $G_{CE}$ adjustment (or $G_T$ adjustment) may be used, in an embodiment. In an embodiment, the $G_{CE}$ (and thus the $G_T$) may be updated at a time interval between about 1 millisecond and about 100 seconds though other longer or shorter time intervals may be used.

Without departing from the scope of the inventive subject matter, Kalman filtering may be used in connection with the look-up tables of power and temperature dependent gain in the MCU of control device 174 to improve the accuracy and to remove noise from the estimation of primary path signal power and output power at output terminal 130 in the out-of-band and in-band frequency ranges.

Also, without departing from the scope of the inventive subject matter, other analog or digital computing or logic devices such as application specific integrated circuits (ASICs), state machines, microprocessors, or digital signal processors (DSP's) with less or greater functionality may be used to realize control device 174. In other embodiments, control device 174 may include an analog integrated circuit. In these embodiments, the analog or digital computing or logic device performs analogously to the MCU used to realize control device 174 as described above. In the alternative analog or digital computing or logic device embodiment, control element 172 may be implemented as an adjustable gain stage, switch, or tuning element as described in FIGS. 3-5. In still other embodiments, where control element 172 includes a switch used to disable or substantially reduce the gain of microwave transistor device 100 when maximum out-of-band power is exceeded, control device 174 may be realized using ADC's coupled to a state machine. In both analog integrated circuit and state machine embodiments, extra-band and in-band power ports 164 and 166 form the inputs for the analog integrated circuit or state machine and the outputs of the analog integrated circuit or state machine are used to actuate control element 172. In still other further embodiments, microprocessors or DSP's may be used to realize control device 174. In these embodiments, microprocessors or DSP's may be used in conjunction with band-limiting low pass filters to directly sample the output voltage of coupled port 156 and to resolve the frequency and power levels of the in-band and out-of-band power levels using signal sampling and low-pass filtering. In these embodiments, control device 174 takes on the functions of both detector 160 and control device 174. In these or other various embodiments, control device 174, control element 172, and/or detector 160 may be realized using the same or different chips.

Figure 2:
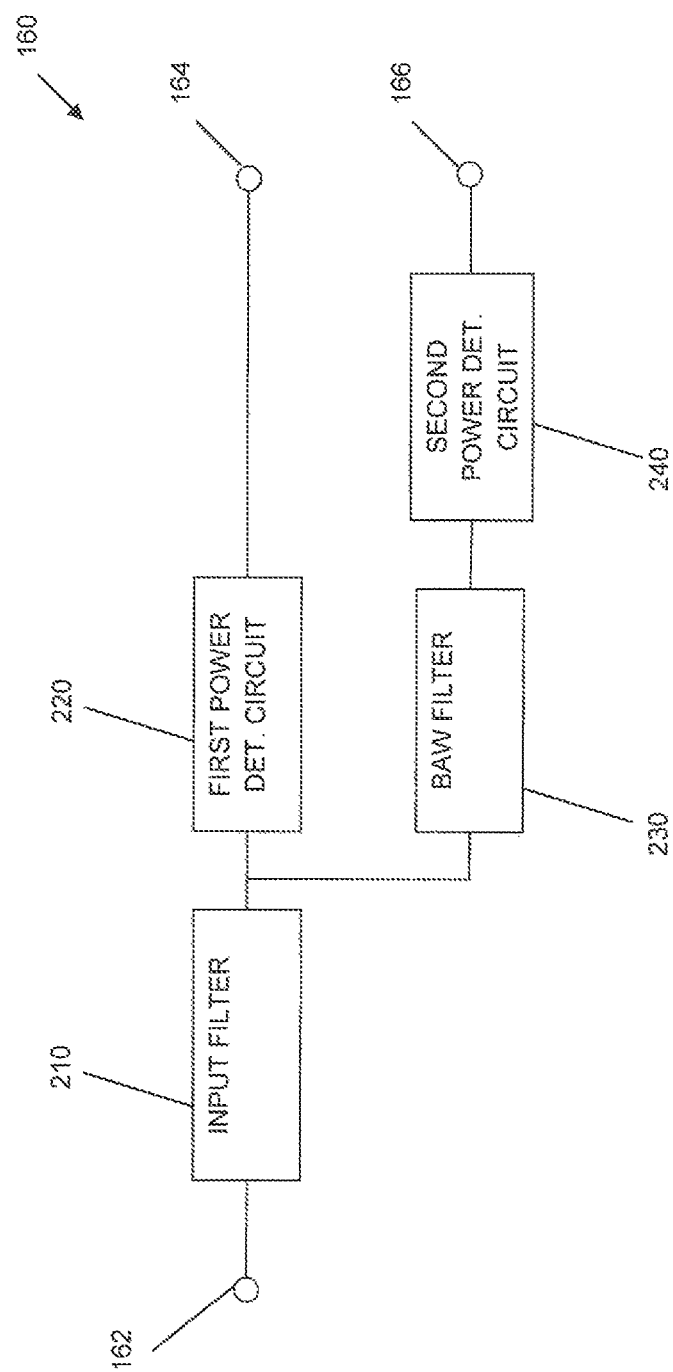
FIG. 2 is a block diagram showing additional detail of an embodiment of the detector of FIG. 1, in accordance with an example embodiment.

FIG. 2 depicts a block diagram showing additional detail of an embodiment of detector 160 of FIG. 1, in accordance with an example embodiment. In an embodiment, detector 160 includes detector input port 162, and extra-band and in-band power ports 164 and 166. In an embodiment, detector 160 includes an input filter 210 that is electrically coupled to input terminal 162, a first power detection circuit 220 electrically coupled to input filter 210, a bandpass bulk acoustic wave (BAW) filter 230 electrically coupled to input filter 210, and a second power detection circuit 240.

In an embodiment, input filter 210 serves to band-limit the signal coupled to detector 160. In an embodiment, input filter 210 may be one of a low-pass, high-pass, or bandpass filter, or a combination of these or other suitable filter types. According to an embodiment, the output of input filter 210 couples to first power detection circuit 220 and BAW filter 230.

According to an embodiment, first and second power detection circuits 220 and 240 contain circuitry (not shown) that provides a power detection function. In an embodiment, this circuitry may include impedance matching circuitry electrically coupling the input of the detector circuit to the anode of a rectifier. The rectifier may include a pn-junction, schottky diode, or other suitable rectifying device. The anode of the rectifier may also be coupled to reference voltage potential 112 of FIG. 1 or other suitable signal ground via a shunt RF choke. The RF choke provides a high impedance path to signal ground at high frequency while providing a direct current (DC) path from the anode of the rectifier to signal ground. A capacitor may provide a low impedance connection from the cathode of the rectifier to ground at the frequency of operation. A bias may be applied to the cathode of the rectifier at this resultant low impedance point using a resistor of an appropriate value. A low-pass filter may be electrically coupled to the cathode of the rectifier where the shunt capacitor has established a low-impedance, high frequency connection. A load may be coupled from the low-pass filter to signal ground. In other embodiments (not shown), first and/or second power detection circuits 220 and 240 may be implemented to detect peak power levels.

In an embodiment, BAW filter 230 receives a signal from input filter 210 and passes only the signal within the specified frequency range for in-band power for transistor device 100. At frequencies outside the specified in-band operation of transistor device 100, BAW filter 230 rejects the signal. In an embodiment, BAW filter 230 may be realized using appropriate semiconductor technology to realize electromechanical structures able to realize pass-bands that allow signals to within the specified in-band frequency range(s) of microwave transistor device 100 and stop-bands adequate to reject signals in very close proximity, but out of the in-band frequency range(s). Without departing from the scope of the inventive subject matter, other embodiments may use surface acoustic wave (SAW), bulk acoustic resonator (BAR), film bulk acoustic resonator (FBAR), or other suitable filter technology to accomplish the same function as BAW filter 230 of the example embodiment.

In an embodiment, BAW filter 230 is electrically coupled to the output of input filter 210 and the input of first power detection circuit 220.

During operation, and according to an embodiment, an output voltage develops at the output of first power detection circuit 220 and extra-band power port 164 that is proportional to the average power level driving transistor device 100 within the pass-band of input filter 210 (i.e., the "extra-band"). In an embodiment, an output voltage develops at the output of second power detection circuit 240 and in-band power port 166 that is proportional to the average power level driving transistor device 100 within the pass-band of BAW filter 230 (i.e., the "in-band"). According to an embodiment, the output voltages that develop at extra-band power port 164 and in-band power port 166 are averaged signals that track the envelope of power ports 164 and 166 over durations that depend on the design of power detection circuits 220 and 230. In an embodiment and depending on the configuration of power detection circuits 220 and 230, the averaged signals may be averaged over a time period commensurate with the baseband frequency (e.g. nano or micro-seconds) or may be averaged over longer durations up to seconds or longer. In other embodiments, the averaged signals may cover longer or shorter durations. Both extra-band power port 164 and in-band power port 166 are electrically coupled to control device 174, according to an embodiment.

Figure 3:
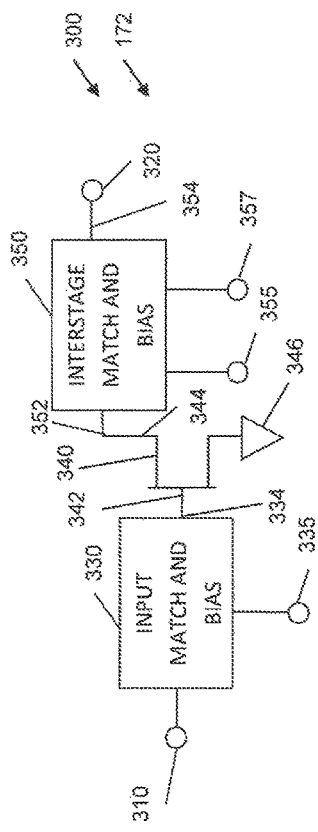
FIGS. 3-5 are a schematic diagrams showing additional details of various embodiments of the control element of FIG. 1.
Figure 4:
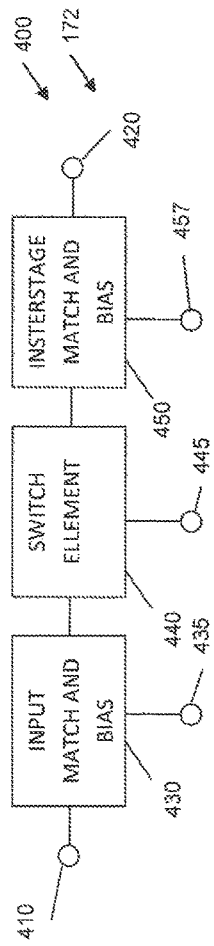
Figure 5:
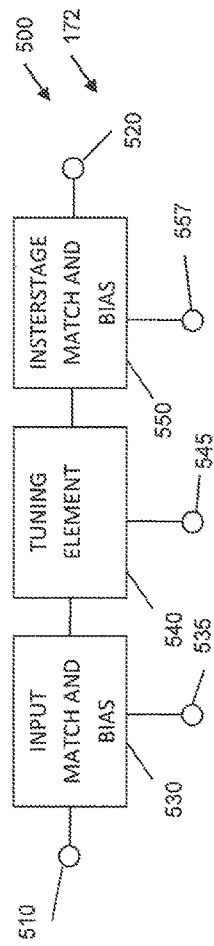

FIGS. 3-5 are schematic diagrams showing additional details of various example embodiments of control element 172 of FIG. 1, in accordance with an example embodiment. Control element 172 may be realized as either a variable gain stage 300 as depicted in FIG. 3, a voltage controlled switch 400 as depicted in FIG. 4, or as a voltage controlled passive or active tuning element 500 as depicted in FIG. 5. In an embodiment, during operation of transistor device 100, control device 174 provides a control signal that changes the gain of control element 172, $G_{CE}$, and hence the output power at output terminal 130 of transistor device 100 according to pre-set criteria that are programmed into control device 174. Whichever embodiment of control element 172 is chosen, control element 172 may be configured to substantially reduce electrical coupling (e.g. reduce $G_{CE}$) between active transistor die 140 and input terminal 120 when control device 174 becomes inactive or otherwise loses electrical coupling between the control device and control element.

Variable gain stage 300 includes an input 310 (e.g., coupled to coupler 150), an output 320 (e.g., coupled to gate terminal 142 of transistor die 140), an input match and bias network 330 electrically coupled to input 310, a radio frequency (RF) driver transistor 340 electrically coupled to input matching and bias network 330, and an interstage match and bias network 350 that is electrically coupled to RF driver transistor 340 and output 320. Input and interstage match and bias networks 330 and 350 provide an impedance match and bias to RF driver transistor 340. In an embodiment, control device 174 is used to adjust the bias of RF driver transistor 340, thus changing its gain and therefore changing the overall gain and output power level of microwave transistor device 100.

In an embodiment, driver transistor 340 is biased in a default inactive state configuration that effectively reduces $G_{CE}$ and the power of the primary path signal (e.g., the signal from input 310 to output 320), unless control device 174 turns RF driver transistor 340 to an active state. In other embodiments, RF driver transistor 340 is configured to reduce the gain, $G_{CE}$, of control element 172 and microwave transistor device 100 to a level low enough to prevent the maximum allowable out-of-band power to be generated at the output of microwave transistor device 100. In an embodiment, control device 174 is used to bias RF driver transistor 340 from a nominally inactive state to a nominally active state, to enable the primary path signal to flow from input 310 to output 320 with maximum transducer gain. In other embodiments, RF driver transistor 340 may be realized in a default "tuned"-state configuration and then switched to the active state by control device 174 if certain preset conditions (e.g., a maximum out-of-band power) are met. In still other configurations, control device 174 may use a tuning element to adjust the tuning conditions presented by control element 172 to control the transducer gain of microwave transistor device 100 as measured from input terminal 120 through output terminal 130 of FIG. 1. In these embodiments, additional detector(s) may be added to the primary signal path from input 310 to output 320 and combined with information on the power level at input terminal 120 as ascertained by measuring the power level at coupled port 156 of FIG. 1. In still other embodiments, additional couplers and detectors (not shown) may be electrically coupled to output terminal 130 of FIG. 1 as a way to observe and control the gain of microwave transistor device 100.

In an embodiment, RF driver transistor 340 may include LDMOS transistors, GaN HFET's, MOSFET's, GaAs pHEMT's, GaAs HBT's, Si BJT's, or other suitable RF transistor technology. In an embodiment, RF driver transistor 340 includes an input 342, output 344, and signal ground 346.

In an embodiment, input match and bias network 330 includes an input 310, an output port 334, and a bias feed 335. In an embodiment, input match and bias network 330 may be realized using one of bondwires, metal-oxide-semiconductor capacitors (MOS-caps), discrete components, or integrated passive devices (IPD's). In an embodiment, IPD's may include components such as inductors, capacitors, transmission lines, or resistors co-located on a common substrate. The IPD's may be formed on the same substrate as RF driver transistor 340 and/or active transistor die 140, or the IPD's may be formed on a substrate separate from RF driver transistor 340 and active transistor die 140. In an embodiment, these components may be configured to provide a DC bias to the input 342 of RF driver transistor 340 that is coupled to the RF signal that may be applied to input 310. In an embodiment, DC bias is supplied to bias feed 335 by control device 174 of FIG. 1. In other embodiments, the DC bias is supplied to bias feed 335 by electrically coupling DC bias feed 335 to external bias connections (e.g., bias leads 1252 of FIG. 12). In other embodiments (not shown), an RF signal superimposed on a DC bias may be applied to input 310. Also, according to an embodiment, the components may be used to transform the input or output impedance of RF driver transistor 340 to the impedance needed to provide an appropriate impedance for input terminal 120 of transistor device 100. In an example embodiment (not shown), one or more inductor(s) realized with IPD's or bondwires may be coupled from input 310 to one or more capacitor(s) realized with one or more discrete or integrated (IPD) capacitor(s). In an embodiment, additional inductor(s) may be connected at the connection of the previously discussed inductor(s) and capacitors. The opposite end of the additional inductor(s), not connected to the aforementioned capacitor(s), may be electrically coupled to output port 334 to form a "T" network, according to an embodiment. The opposite connection of the capacitor(s), not connected at the node connecting the aforementioned inductors and capacitor(s), may be connected to an RF and/or DC ground or other suitable low impedance point(s) to form "T" network(s). The "T" network(s) may be configured to transform the impedance seen at input port 332 of input match and bias network 330 to that presented to input 342 of RF transistor 340. In an embodiment, bias feed 335 may be connected to input match and bias network 330 by creating bias element(s) including one or more of suitable inductor(s), high impedance transmission line(s), quarter wave length section(s), or suitable resistor(s). The bias element(s) creates a high impedance point that is connected to a low impedance RF "cold point" at the same DC potential as output port 334 and input 342 to RF driver transistor 340, according to an embodiment. Without departing from the scope of the inventive subject matter, in other embodiments, other impedance matching and bias network topologies (not shown) may be used to realize input match and bias network 330.

Interstage match and bias network 350 includes input port 352, an output port 354, and a bias feed 355, according to an embodiment. In an embodiment, interstage match and bias network 350 may be realized using structures analogous to those of input match and bias network 330. In an embodiment, interstage match and bias network 350 is designed to provide an impedance match between RF driver transistor 340 and active transistor die 140 of FIG. 1. In an embodiment, interstage match and bias network 340 is also used to tailor the gain profile of microwave transistor device 100 using prescribed gain versus frequency slope(s). In an embodiment, interstage match and bias network 350 supplies DC bias to the output 344 of RF driver transistor 340. In an embodiment, the matching and bias topology chosen may be adapted to carry a sufficient amount of current to provide biasing to RF driver transistor 340. In an embodiment, DC bias is supplied to bias feed 355 by control device 174 of FIG. 1. In further embodiments, an active or passive switch element may be used to enable control device 174 to direct application of bias with sufficient current to bias feed 355. In other embodiments, the DC bias is supplied to bias feed 355 by electrically coupling DC bias feed 355 to external bias connections (e.g., bias leads 1252 of FIG. 12). In an embodiment, and analogous to input match and bias network 330, interstage match and bias network 350 may also be used to supply a DC bias to gate terminal 142 of active transistor die 140 through bias feed 357. In still other and further embodiments, DC bias is supplied to bias feed 357 by control device 174 of FIG. 1 to control the gain and power of active transistor die 140. Without departing from the scope of the inventive subject matter, control device 174 may be used to control the DC bias to one or a combination of bias feeds 335, 355, and 357 according to the design goals of any specific embodiment. Furthermore, without departing from the scope of the inventive subject matter, one or more of input match and bias network 330, RF driver transistor 340, and/or interstage match and bias network 350, may be omitted from an embodiment to simplify the design and implementation.

During operation of transistor device 100, control device 174 supplies a bias voltage to bias feed 335 of input match and bias network 330, and/or bias feeds 355 and 357 of interstage match and bias network 350, according to an embodiment. The level of the bias supplied can be used to control the gain, $G_{CE}$, of control element 172 and thus output power of transistor device 100.

FIG. 4 depicts details of a switch implementation 400 of control element 172 that controls the gain and power of microwave transistor device 100. In an embodiment of switch configuration embodiment 400 of control element 172, control element 172 reduces the gain of microwave transistor device 100 so that microwave transistor device 100 is not likely to produce an output power that exceeds the maximum allowable out-of-band power referred to in the discussion of FIGS. 1, 6-7, and 9-10.

RF switch embodiment 400 of control element 172 includes an input 410 (e.g., coupled to coupler 150), an output 420 (e.g., coupled to gate terminal 142 of transistor die 140), input match and bias network 430 electrically coupled to input 410, a switch element 440 coupled to input match and bias network 430, and an interstage match and bias network 450 that is electrically coupled to switch element 440 and output 420. Input and interstage match and bias networks 430 and 450 provide RF matching to switch element 440 and are realized analogously to input and interstage match and bias networks 330 and 350 of FIG. 3. In an embodiment, interstage match and bias network 450 also includes bias input 457 to provide a bias to active transistor die 140 of FIG. 1.

In an embodiment, switch element 440 is realized in a default "off" state configuration that effectively blocks the primary path signal (e.g., the signal from input 410 to output 420), unless control device 174 turns switch element 440 to an "on" state. In other embodiments, switch element 440 is configured to reduce the gain, $G_{CE}$, of control element 172 and thus the gain, $G_T$, of microwave transistor device 100 to a level low enough to prevent the maximum allowable out-of-band power to be generated at the output of microwave transistor device 100. In an embodiment, control element 174 is used to actuate switch element 440 from a nominally "off" state to a nominally "on" state, which enables the primary path signal to flow from input 410 to output 420 with minimal attenuation. In other embodiments, switch element 440 may be realized in a default "on"-state configuration and then switched to the "off" state by control device 174 if certain preset conditions are met (e.g., a maximum allowable out-of-band power is exceeded).

Input and interstage match and bias networks 430 and 450 are implemented and used analogously to input and interstage match and bias networks 330 and 350 of FIG. 3, according to an embodiment. In an embodiment, DC bias may be supplied to bias feeds 435 and 457 by control device 174 of FIG. 1. In other embodiments, the DC bias is supplied to bias feeds 435 and/or 457 by electrically coupling bias feeds 435 and/or 457 to external bias connections (e.g., bias leads 1252 of FIG. 12). In an embodiment, and analogous to input match and bias network 330 and interstage match and bias network 350, interstage match and bias network 450 may also be used to supply a DC bias to gate terminal 142 of active transistor die 140 through bias feed 457. In still other and further embodiments, DC bias is supplied to bias feed 457 by control device 174 of FIG. 1 to control the gain and power of active transistor die 140. Without departing from the scope of the inventive subject matter, control device 174 may be used to control the DC bias to one or a combination of bias feeds 435 and 457 according to the design goals of any specific embodiment. Furthermore, without departing from the scope of the inventive subject matter, one or more of input match and bias network 430, switch element 440, and/or interstage match and bias network 450, may be omitted from an embodiment to simplify the design and implementation.

In an embodiment, input match network 430 and interstage match and bias network 450 may be realized using structures analogous to those of input match and bias network 330 of FIG. 3. In an embodiment, switch element 440 may include one or more transistors and other circuit components configured to operate as an RF switch. In an embodiment, transistors used to realize switch element 440 may include LDMOS transistors, GaN HFET's, GaAs pHEMT's, GaAs HBT's, Si BJT's or other suitable RF transistor technologies. In other embodiments, switch element 440 may include one or more of Schottky diodes, p-type, intrinsic, p-type-intrinsic-n-type (p-i-n) junction diodes, or other suitable RF switching diodes. In still other embodiments, RF switches may be realized using microelectronic mechanical systems (MEMS).

FIG. 5 depicts details of a voltage controlled tuning element 500 embodiment of control element 172 that controls the gain and power of microwave transistor device 100 using a voltage-controlled tuning element 500. The tuning element embodiment 500 of control element 172 includes an input 510 (e.g., coupled to coupler 150), an output 520 (e.g., coupled to gate terminal 142 of transistor die 140), input match and bias network 530 electrically coupled to input 510, a tuning element 540 coupled to input match and bias network 530, and an interstage match and bias network 550 that is electrically coupled to tuning element 540 and output 520. Input and interstage match and bias networks 530 and 550 provide RF matching to tuning element 540 and are realized analogously to input and interstage match and bias networks 330 and 350 of FIG. 3. In an embodiment, control device 174 may be used to actuate tuning element 540 to adjust the gain, $G_{CE}$, of control element 172 and thus the gain, $G_T$, of microwave transistor device 100. In an embodiment, interstage match and bias network 550 also includes bias input 557 to provide a bias to active transistor die 140 of FIG. 1.

During operation of transistor device 100, control device 174 supplies a bias voltage to control input terminal 545 of tuning element 540 and/or bias feed 557 of interstage match and bias network 550, according to an embodiment. The level of the bias supplied to tuning element 540 is used to control the gain and thus output power of transistor device 100.

In an embodiment, tuning element 540 is realized in a default "de-tuned" state configuration that effectively reduces gain of the primary path signal (e.g., the signal from input 510 to output 520), unless control device 174 turns tuning element 540 to a "tuned" state. In other embodiments, tuning element 540 is configured to reduce the gain, $G_{CE}$, of control element 172 and thus the gain, $G_T$, of microwave transistor device 100 to a level low enough to prevent the maximum allowable out-of-band power to be generated at the output 130 of microwave transistor device 100. In an embodiment, control device 174 is used to actuate tuning element 540 from a nominally "de-tuned" state to a nominally "tuned" state, to enable the primary path signal to flow from input 510 to output 520 with maximum transducer gain. In other embodiments, tuning element 540 may be realized in a default "tuned"-state configuration and then switched to the "de-tuned" state by control device 174 if certain preset conditions are met (e.g., a maximum out-of-band power is exceeded). In still other configurations, control device 174 may use tuning element 500 to adjust the tuning conditions presented by control element 172 to control the transducer gain of microwave transistor device 100 as measured from input terminal 120 through output terminal 130 of FIG. 1. In these embodiments, additional detector(s) may be added to the primary signal path from input 510 to output 520 and combined with information on the power level at input terminal 120 as ascertained by measuring the power level at coupled port 156 of FIG. 1. In still other embodiments, additional couplers and detectors (not shown) may be electrically coupled to output terminal 130 of FIG. 1 as a way to observe and control the gain of microwave transistor device 100.

Input and interstage match and bias networks 530 and 550 are implemented and used analogously to input and interstage match and bias networks 330 and 350 of FIG. 3, according to an embodiment. In an embodiment, DC bias may be supplied to bias feeds 535 and 557 by control device 174 of FIG. 1. In other embodiments, the DC bias is supplied to bias feeds 535 and/or 557 by electrically coupling bias feeds 535 and/or 557 to external bias connections (e.g., bias leads 1252 of FIG. 12). In an embodiment, and analogous to input match and bias network 330 and interstage match and bias network 350, interstage match and bias network 550 may also be used to supply a DC bias to gate terminal 142 of active transistor die 140 through bias feed 557. In still other and further embodiments, DC bias is supplied to bias feed 557 by control device 174 of FIG. 1 to control the gain and power of active transistor die 140. Without departing from the scope of the inventive subject matter, control device 174 may be used to control the DC bias to one or a combination of bias feeds 535 and 557 according to the design goals of any specific embodiment. Furthermore, without departing from the scope of the inventive subject matter, one or more of input match and bias network 530, tuning element 540, and/or interstage match and bias network 550, may be omitted from an embodiment to simplify the design and implementation.

In an embodiment, tuning element 540 may include one or more p-i-n diodes and other circuit components configured to operate as a voltage controlled tuning element. In an embodiment, devices used to realize tuning element 540 may include varactors, pn diodes, schottky diodes, or other suitable voltage controlled tuning element(s). In other embodiments, tuning element 540 may be realized using MEMS passive elements.

Figure 6:
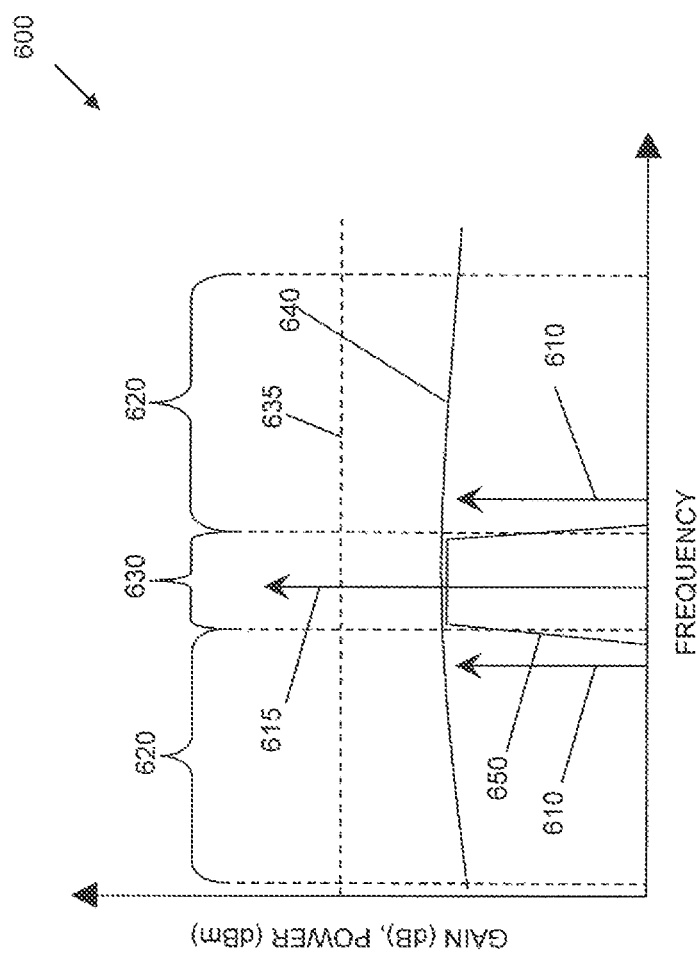
FIGS. 6-7 are a graphs illustrating further details of operation of the microwave transistor device of FIG. 1 and method according to an example embodiment.
Figure 7:
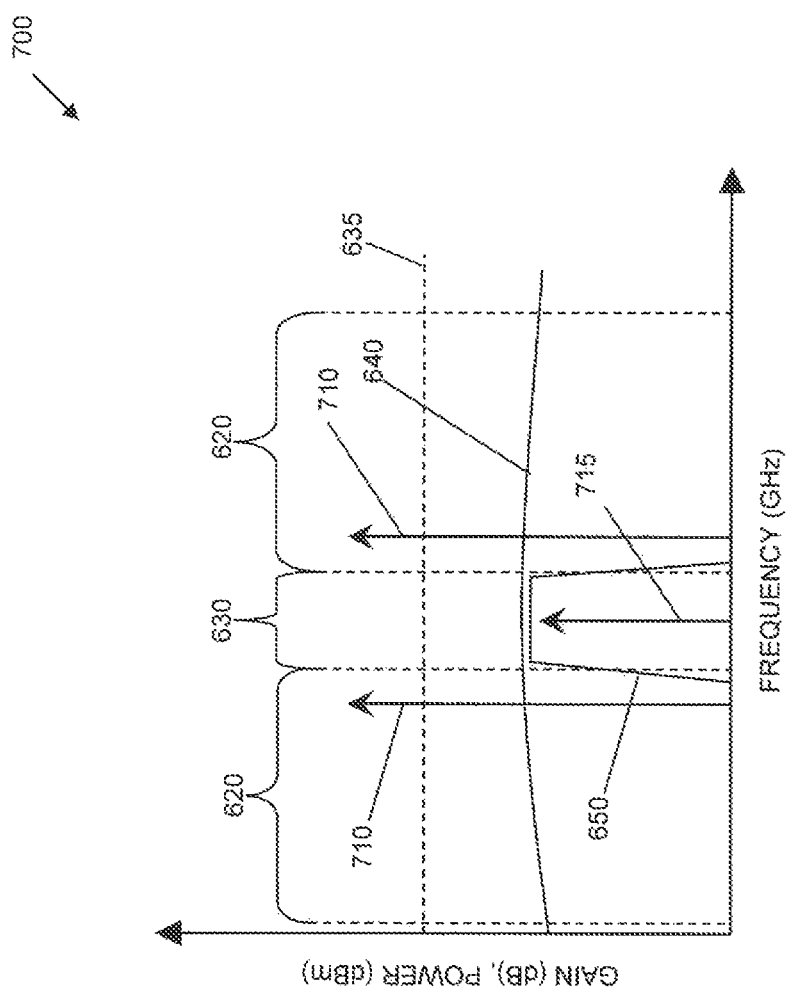

FIGS. 6-7 are graphs illustrating further details of operation of microwave transistor device 100 of FIG. 1 and method according to an example embodiment. Along the frequency axis, frequencies include an in-band frequency range 630 and two out-of-band frequency ranges 620 (one on either side of in-band frequency range 630). Those of skill in the art would understand, based on the description herein, that embodiments also may apply to systems in which multiple in-band frequency ranges are defined, and/or systems in which only a single out-of-band frequency range or more than two out-of-band frequency ranges are defined. In FIGS. 6 and 7, vectors 610 and 710 represent the estimated out-of-band output power levels at output 130 of transistor device 100, and vectors 615 and 715 represent the estimated in-band output power levels at output 130. Threshold 635 represents a maximum allowable out-of-band power level, and traces 640 and 650 represent gain characteristics of BAW filter 230 and input filter 210, respectively.

FIG. 6 depicts a graph of power in dBm and gain in dB versus frequency in GHz describing the operation of microwave transistor device 100 in a nominal operating state 600 according to an embodiment. In an embodiment, transistor device 100 is in a nominal operating state 600 when the total power contained in out-of-band signal power levels 610 in out-of-band frequency range(s) 620 is less than a maximum allowable out-of-band power level 635. In an embodiment, if transistor device 100 is in a nominal operating state 600 (e.g., input signal power levels 610 are less than maximum allowable out-of-band power 635) then the state of microwave transistor 100 is allowed to function normally (e.g., at its specified power). In an embodiment, microwave transistor device 100 may be allowed to function normally in nominal operating state 600, even when extra-band signal power level 615 (i.e., the signal power level in both the in-band and out-of band frequency ranges 620 and 630) is less than or greater than maximum allowable out-of-band power 635. In an embodiment, maximum allowable out-of-band power level 635 corresponds to a maximum allowable out-of-band output power seen at output terminal 130 of FIG. 1 (not shown). In an embodiment, extra-band signal power (i.e., the combination of out-of-band and in-band powers 610 and 615) is measured as the output of first power detection circuit 220 that corresponds to the RF power that passes through input filter 210 of FIG. 2 with gain characteristic 640. In an embodiment, in-band signal power level 615 is measured as the output of second power detection circuit 240 that corresponds to the RF power that is allowed to pass through BAW filter 230 of FIG. 2 with gain characteristic 650 (BAW filter 230 blocks out-of-band signal 610).

According to an embodiment, in nominal operating state 600, where the combined in-band and out-of-band signal power levels 610 and 615 (i.e., the extra-band power level) is below out-of-band power limit 635, and is within both first and second frequency range(s) 620 and 630 (that is to say within the pass-bands of both input filter 210 and BAW filter 230), control device circuitry 170 allows microwave transistor device 100 to continue to function normally as a transistor device with full gain and output power capability. In an embodiment, while in nominal operating state 600, microwave transistor device 100 may function with full gain and output power capability, even when in-band signal power level 615 exceeds maximum out-of-band power limit 635.

FIG. 7 depicts a graph of power in dBm and gain in dB versus frequency in GHz describing the operation of microwave transistor device 100 in a controlled operating state 700 according to an embodiment. In an embodiment, transistor device 100 is in a controlled operating state 700 when the total power contained in out-of-band signal power levels 710 in out-of-band frequency range 620 is greater than a maximum allowable out-of-band power level 635. In an embodiment, if transistor device 100 is in a controlled operating state 700 when the total power contained in out-of-band signal power levels 710 is greater than maximum allowable out-of-band power 635. This is the case regardless of whether in-band signal power level 715 in in-band frequency range(s) 630 is less than or greater than maximum allowable out-of-band power 635. In an embodiment, maximum allowable out-of-band power level 635 corresponds to a maximum allowable out-of-band power seen at output terminal 130 of FIG. 1 (not shown).

In an embodiment, in controlled operating state 700, where power level 710 is above out-of-band power limit 635, and is outside in-band frequency range 630, control device circuitry 170 reduces the gain of microwave transistor device 100. When a control element 172 such as control element 300 is used, this may be accomplished by adjusting the bias applied to RF driver device 340 of FIG. 3 and/or active transistor die 140 of FIG. 1 to bring the out-of-band output power level at terminal 130 (i.e., the power that control circuitry 170 predicts based on the signal power level 710) below the maximum allowable out-of-band output power. After reducing the gain, microwave transistor device 100 may operate at reduced output power for a pre-determined amount of time, according to an embodiment. In other embodiments, where the switch implementation 400 of control element 172 of FIG. 4 is used, control device circuitry 170 disables microwave transistor device 100 by reducing the gain of the control element 172 to a low value (e.g., less than −10 dB) sufficient to reduce the out-of-band output power at output terminal 130 to a value below the maximum allowable out-of-band output power. In still other embodiments, where the tuning element implementation 500 of control element 172 of FIG. 5 is used, control device circuitry 170 reduces the gain of microwave transistor device 100 by de-tuning the impedance matching network. This effectively reduces the gain of the control element, $G_{CE}$, 172 to a low value (e.g., less than −10 dB) sufficient to reduce the out-of-band output power at output terminal 130 to a value below the maximum allowable out-of-band output power.

Figure 8:
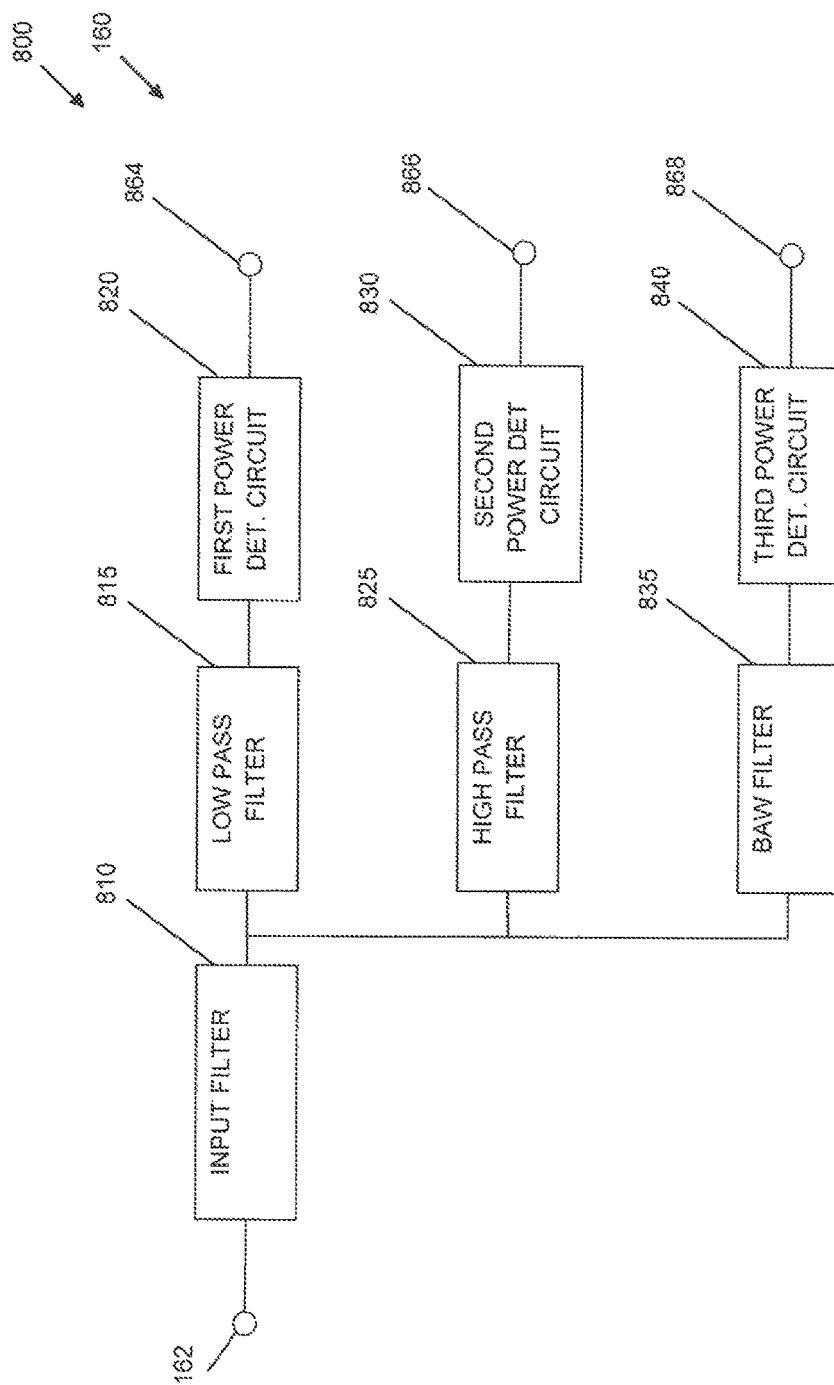
FIG. 8 depicts a block diagram showing additional details of an alternate embodiment of the detector of FIG. 1, in accordance with an example embodiment.

FIG. 8 depicts a block diagram showing additional detail of an alternate embodiment of detector 160, referred to herein as detector 800, in accordance with an example embodiment. Detector 800 is used for applications where it is desired to control the operation of microwave transistor device 100 depending on whether out-of-band power is above or below a maximum allowable out-of-band power that may be specified differently for a first out-of-band frequency range above the specified frequency of operation and for a second out-of-band frequency range below the specified frequency of operation. In an embodiment, detector 800 includes a detector input port 162 and first, second, and third power ports 864, 866, and 868. Detector 800 may include an input filter 810 (e.g., analogous to input filter 210, FIG. 2) that is electrically coupled to input terminal 162, according to an embodiment.

In an embodiment, a low-pass filter 815 is electrically coupled to output of input filter 810. A first power detection circuit 820 may be electrically coupled to the output of low-pass filter 815, according to an embodiment. In an embodiment, the output of first power detection circuit 820 may be electrically coupled through first low-side, out-of-band power port 864 to control device 174 of control circuitry 170 of FIG. 1. According to an embodiment, the low-pass filter 815 has an upper cutoff frequency at approximately the lowest frequency that defines the in-band frequency range (e.g., frequency range 940, FIG. 9).

In an embodiment, a high-pass filter 825 is electrically coupled to the output of input filter 810. A second power detection circuit 830 is electrically coupled to the output of high-pass filter 825, according to an embodiment. In an embodiment, the output of second power detection circuit 830 is electrically coupled to control device 174 of control circuitry 170 via high-side, out-of-band power port 866. According to an embodiment, the high-pass filter 825 has a lower cutoff frequency at approximately the highest frequency that defines the in-band frequency range (e.g., frequency range 940, FIG. 9).

In an embodiment, the input of a BAW filter 835 is electrically coupled to the output of input filter 810. In an embodiment, a third power detection circuit 840 is coupled to the output of the BAW filter. The output of third power detection circuit 840 is coupled to control device 174 via in-band power port 868. According to an embodiment, the BAW filter 835 has a pass-band defined by the in-band frequency range (e.g., frequency range 940, FIG. 9).

In an embodiment, input filter 810 has the same configuration as input filter 210 of FIG. 2. Also, first, second, and third power detection circuits 820, 830, and 840 are configured analogously to first and second power detection circuits 220 and 240 of FIG. 2. BAW filter 835 is configured in a manner analogous to the description of BAW filter 230 of FIG. 2.

During operation, and according to an embodiment, an output voltage develops at the output of first power detection circuit 820 and low-side, out-of-band power port 864 that is proportional to the average power level driving transistor device 100 within the pass-band of input filter 210 and low-pass filter 815. In an embodiment, an output voltage develops at the output of second power detection circuit 830 and high-side, out-of-band power port 866 that is proportional to the average power level driving transistor device 100 within the pass-band of input filter 810 and high-pass filter 825. In an embodiment, an output voltage develops at the output of third power detection circuit 840 and in-band power port 868 that is proportional to the average power level driving transistor device 100 within the pass-band of input filter 810 and BAW filter 835. According to an embodiment, the output voltages that develop at power ports 864, 866, and 868 are averaged signals that track the envelope of their respective signals over durations that depend on the design of power detection circuits 820, 830, and 840. In an embodiment and depending on the configuration of power detection circuits 820, 830, and 840, the averaged signals may be averaged over a time period commensurate with the baseband frequency (e.g. nano or micro-seconds) or may be averaged over longer durations up to seconds or longer. In other embodiments, the averaged signals may cover longer or shorter durations. Power ports 864, 866, and 868 connect to control device 174 of control circuitry 170, according to an embodiment.

In an embodiment, detector 800 is used in place of detector 160 of FIGS. 1 and 2 in applications where it is desired to control the operation of microwave transistor device 100 based on the out-of-band power at frequencies both above and below the pass-band of BAW filter 835.

Without departing from the scope of the inventive subject matter, in other embodiments, additional branches with low-pass, high-pass, or BAW filters, may be added to detector 800 to allow the flexibility to monitor power around multiple pass bands (defined by the BAW filters). In addition, in some embodiments, other frequency detection techniques may be used to reduce the complexity of the hardware used in detectors 160 and 800. In these embodiments, Kalman filtering within control device 174 may be used with the measured characteristics of low-pass and high pass filters (e.g., filters 815 and 825) to estimate in-band and out-of-band power levels to determine whether a maximum allowable out-of-band power limit has been reached.

Figure 9:
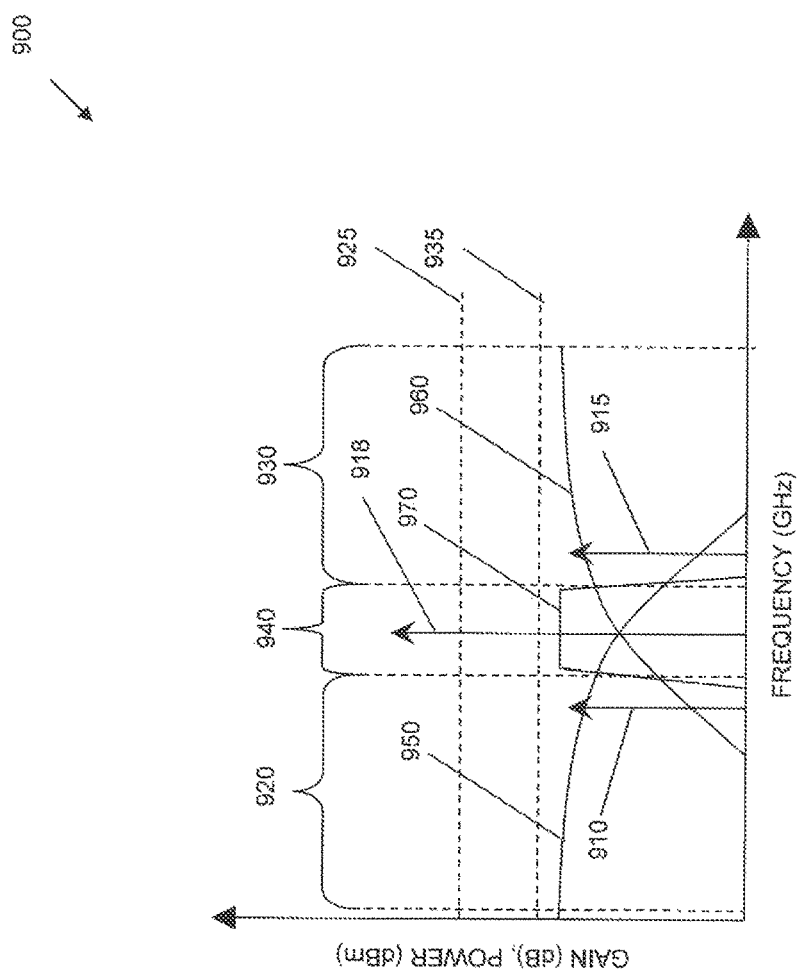
FIGS. 9-10 are a graphs illustrating further details of operation of the microwave transistor device of FIG. 1 and method and according to an embodiment.
Figure 10:
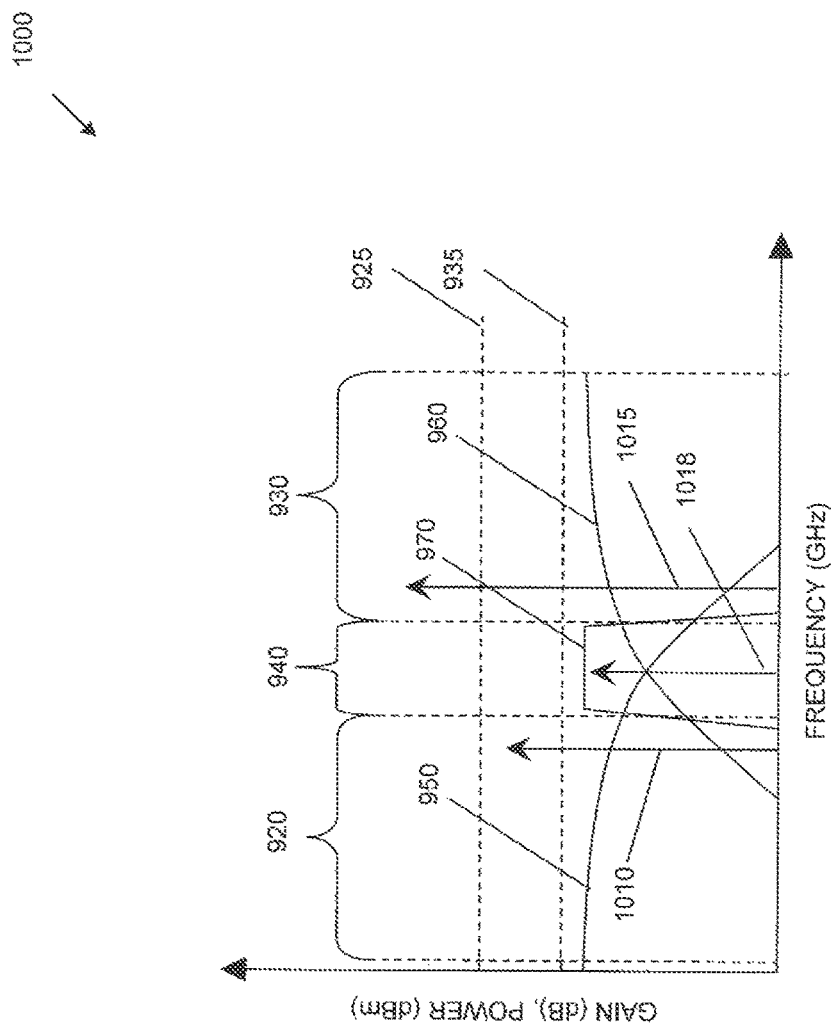

FIGS. 9-10 depict graphs illustrating further details of operation microwave transistor device 100 of FIG. 1 and its method of operation using detector 800 of FIG. 8, according to an embodiment. Along the frequency axis, frequencies include an in-band frequency range 940, a low-side, out-of-band frequency range 920, and a high-side, out-of-band frequency range 930. In FIGS. 9 and 10, vectors 910 and 1010 represent the estimated, low-side, out-of-band output power levels at output 130 of transistor device 100, vectors 915 and 1015 represent the estimated, high-side, out-of-band output power levels at output 130 of transistor device 100, and vectors 918 and 1018 represent the estimated in-band output power levels at output 130. Threshold 925 represents a maximum allowable low-side, out-of-band power level, threshold 935 represents a maximum allowable high-side, out-of-band power level, and traces 950, 960, and 970 represent gain characteristics of filters 815, 825, and 835, respectively.

FIG. 9 depicts a graph of power in dBm and gain in dB versus frequency in GHz describing the operation of microwave transistor device 100 in a nominal operating state 900, analogous to nominal operating state 600 of FIG. 6, according to an embodiment. In an embodiment, microwave transistor device 100 is in a nominal operating state 900 when the total power represented by out-of-band signal power level 910 in a first, low-side out-of-band frequency range 920 is less than a first maximum allowable out-of-band power level 925, and the total power represented by out-of-band input signal power level 915 in a second, high-side out-of-band frequency range 930 is less than a second maximum allowable out-of-band power level 935. In an embodiment, if transistor device 100 is in a nominal operating state 900 (e.g., out-of-band input signal power levels 910 and 915 are less than maximum allowable out-of-band power levels 925 and 935), then microwave transistor device 100 may be allowed to operate at full gain and power capability, even when input signal power level 918 in the in-band frequency range 940 is less than or greater than maximum allowable out-of-band powers 925 and 935.

In an embodiment, maximum allowable out-of-band power levels 925 and 935 correspond to a maximum allowable out-of-band output power seen at output terminal 130 of FIG. 1 (not shown). In an embodiment, first out-of-band signal power level 910 is measured as the output of first power detection circuit 820 that corresponds to the RF power that passes through input filter 810 and low-pass filter 815 of FIG. 8 with gain characteristic 950. In an embodiment, second out-of-band signal power level 915 is measured as the output of second power detection circuit 830 that corresponds to the RF power that is allowed to pass through high-pass filter 825 of FIG. 8 with gain characteristic 960. In an embodiment, in-band input signal power level 918 is measured as the output of third power detection circuit 940 that corresponds to the RF power that is allowed to pass through BAW filter 835 of FIG. 8 with gain characteristic 970.

According to an embodiment, and analogous to nominal operating state 600 of FIG. 6, in nominal operating state 900, where power level 918 is above out-of-band power limits 925 and 935, but within third frequency range 940 (that is to say within pass-band of both input filter 810 and BAW filter 835 of FIG. 8), control device circuitry 170 allows microwave transistor device 100 to continue to function normally as a transistor device with full gain and output power capability. In an embodiment, while in nominal operating state 900, microwave transistor device 100 may function with full gain and output power capability, even when input signal power level 918 exceeds maximum allowable out-of-band power levels 925 and 935.

FIG. 10 depicts a graph of power in dBm and gain in dB versus frequency in GHz describing the operation of microwave transistor device 100 in a controlled operating state 1000, analogous to nominal operating state 700 of FIG. 7, according to an embodiment. In an embodiment, transistor device 100 enters a controlled operating state 1000 when the total of input signal power level 1010 in the low-side, out-of-band frequency range 920 exceeds the first out-ofband maximum allowable power level 925, or when the total of input signal power level 1015 in the high-side, out-of-band frequency range 930 exceeds the second out-of-band maximum allowable power level 935. In an embodiment, if transistor device 100 is in a controlled operating state 1000 (e.g., signal power levels 1010 or 1015 exceed maximum allowable out-of-band power levels 925 and/or 935) regardless of whether signal power level 1018 in the in-band frequency range 940 is less than or greater than maximum allowable out-of-band powers 925 and/or 945. In an embodiment, the low-side, out-of-band signal power level 1010 is measured as the output of first power detection circuits 820 that corresponds to the RF power that passes through input filter 810 and low-pass filter 815 of FIG. 8 with gain characteristic 950. In an embodiment, the high-side, out-of-band power level 1015 is measured as the output of second power detection circuit 830 that corresponds to the RF power that is allowed to pass through high-pass filter 825 of FIG. 8 with gain characteristic 960. In an embodiment, in-band power level 1018 is measured as the output of third power detection circuit 940 that corresponds to the RF power that is allowed to pass through BAW filter 835 of FIG. 8 with gain characteristic 970.

In an embodiment, in controlled operating state 1000 where power level 1010 in low-side, out-of-band frequency range 920 exceeds out-of-band power limit 925 or, alternatively, power level 1015 in high-side, out-of-band frequency range 930 exceeds out-of-band power limit 935, control device circuitry 170 reduces the gain of microwave transistor device 100. When a control element 172 such as control element 300 is used, this may be accomplished by adjusting the bias applied to driver device 340 of FIG. 3 to bring the output power level at terminal 130 (i.e., the power that control circuitry 170 predicts based on the signal power level 1010 and/or 1015) below the maximum allowable out-of-band output power. In an embodiment, control device 174 may use stored gain information about microwave transistor device 100 versus output power and temperature described in connection with FIG. 1 to determine a maximum out-of-band power level at input terminal 120 that corresponds to a maximum out-of-band power at the output terminal 130 of microwave transistor device 100. Analogous to the description of controlled operating state 700 of FIG. 7, by reducing the gain upon entering controlled operating state 1000, control circuitry 170 may cause microwave transistor device 100 to operate at reduced output power for a pre-determined amount of time, according to an embodiment. In other embodiments, where the switch implementation 400 of control element 172 of FIG. 4 is used, control device circuitry 170 may disable microwave transistor device 100 by reducing the gain of the control element, $G_{CE}$ 172 to a very low value (e.g., less than −10 dB).

Figure 11:
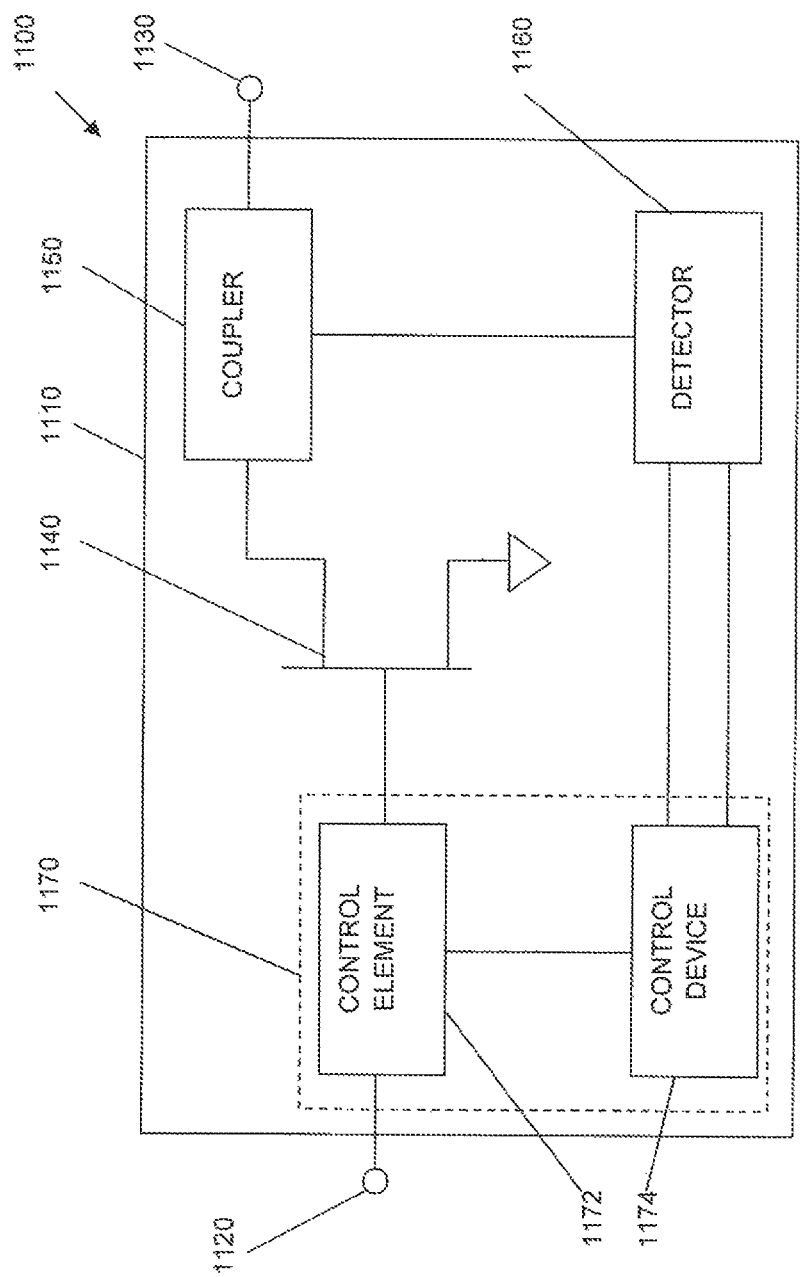
FIG. 11 illustrates an alternate embodiment of a microwave transistor device, in accordance with an alternate embodiment.

FIG. 11 illustrates an alternate embodiment of a microwave transistor device 1100 in accordance with an alternate embodiment. In an embodiment, microwave transistor device 1100 includes package 1110 with input terminal 1120 and output terminal 1130, active transistor die 1140 coupled to package 1110 and electrically coupled to at least one of the input terminal 1120 and output terminal 1130, coupler 1150 coupled to package 1110 and electrically coupled to output terminal 1130, detector 1160 coupled to package 1110, and electrically coupled to the coupler 1150, and control circuitry 1170 coupled to the package and electrically coupled to the active transistor die 1140, the coupler 1150, and the detector 1160. In an embodiment, active transistor die 1140 is coupled to package 1110 and electrically coupled to the control circuitry 1170 and output terminal 1130. According to an embodiment, the connection of elements and signals 1140, 1150, 1160, and 1170 is analogous to that described in connection with FIG. 1. In this embodiment, however, the input port of coupler 1150 is coupled to output terminal 1130 (rather than being coupled to the input terminal). Thus, control circuitry 1170 reads output power directly from output coupler 1150 that is electrically coupled to output terminal 1130. Operation of alternate embodiment of microwave transistor device 1100 operates in a manner analogous to microwave transistor device 100 described in FIGS. 1-10, herein.

Figure 12:
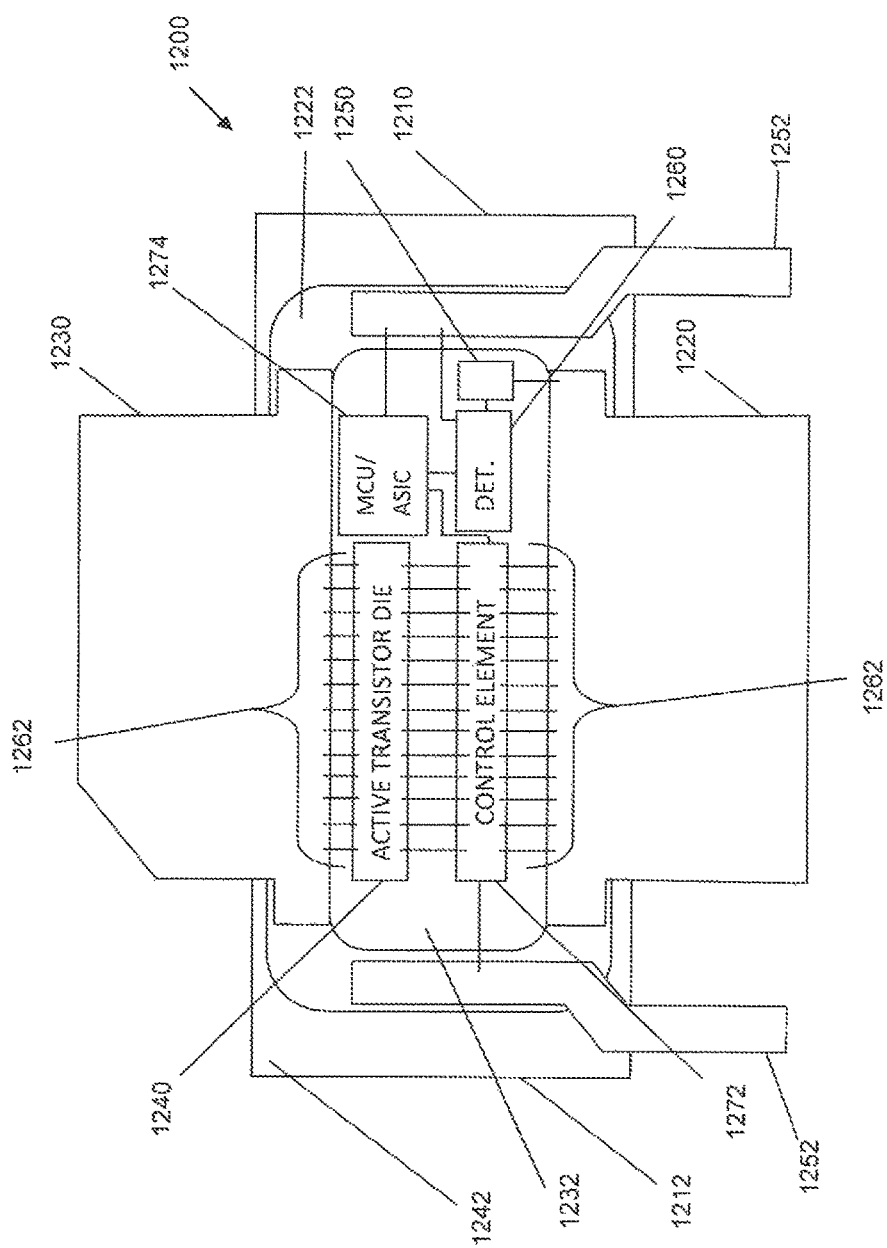
FIG. 12 illustrates a top-down view of the microwave transistor device of FIG. 1, according to an example embodiment.

FIG. 12 illustrates a top-down view of a physical implementation of a microwave transistor device 1200 (e.g., implementing the block diagram of the device 100 of FIG. 1), according to an example embodiment. In an embodiment, microwave transistor device 1200 includes a package 1210 with an input terminal 1220 and an output terminal 1230. In an embodiment, active transistor die 1240, a coupler 1250, a detector 1260, control element 1272 and control device 1274 (e.g., an MCU and/or ASIC) are die bonded to package 1210. In an embodiment, active transistor die 1240 is electrically coupled to at least one of input terminal 1220 and output terminal 1230. In an embodiment, coupler 1250 is electrically coupled to input terminal 1220 and detector 1260. Detector 1260 is electrically coupled to coupler 1250 and control device 1274.

In an embodiment, transistor package 1210 is realized as a radio frequency (RF) package. Package 1210 includes a flange 1212 that is coupled to a lead frame 1222, input terminal 1220 and output terminal 1230 that are coupled to lead frame 1222, a cavity 1232 within lead frame 1222 and over an upper surface 1242 of flange 1212, and auxiliary bias terminals 1252. In an embodiment, active transistor die 1240, coupler 1250, detector 1260, control element 1272, and control device 1274 are bonded to upper surface 1242 of flange 1212 within cavity 1232. In an embodiment, bond-wires 1262 provide electrical connections between input terminal 1220 and control element 1272, output terminal 1230 and active transistor die 1240, as well as control element 1272 and active transistor die 1240.

In an embodiment, transistor package 1210 may be an air-cavity ceramic package wherein a lid (not shown) is placed over cavity 1232 and in contact with lead frame 1222. In other embodiments, transistor package may be an over-molded plastic package wherein over-molding material is disposed over and encapsulates active transistor die 1240, coupler 1250, detector 1260, bond wires 1262, and control element 1270. In other embodiments, package 1210 may be an air-cavity plastic package wherein active transistor die 1240, coupler 1250, detector 1260, and control element 1270 are within a hollow opening or void formed within plastic over-molding material.

In an embodiment, as well as altering device operation based on estimates of out-of-band power levels, control device 1274 and control element 1272 also may be configured to prevent transistor operation if package 1210 is opened or tampered with. To this end, and in an embodiment, electrical connection(s) between control element 1272 and control device 1274 may be placed under bondwires 1262 between control element 1272 and active transistor die 1240. In other embodiments, bond wire electrical connections between control device 1274 and control element 1272 may be attached to the package lid (not shown) to facilitate disconnecting control element 1272 from control device 1274 if the package lid is removed. In other embodiments (not shown), detector 1260 and/or control device 1274 may be integrated into the package lid or on a printed circuit board disposed above active transistor die 1240 and control element 1270. In other embodiments (not shown), it may be desired to increase tamper resistance by encapsulating some components (e.g. one or more of coupler 1250, detector 1260, bond wires 1262, control element 1270, and/or other relevant components) with over-molding material, but not encapsulating other components (e.g. control element 1270 or active transistor die 1240, or other relevant components) to enhance device gain and other performance parameters. In these embodiments, air cavity packages may be used in conjunction with over-molding material(s).

Figure 13:
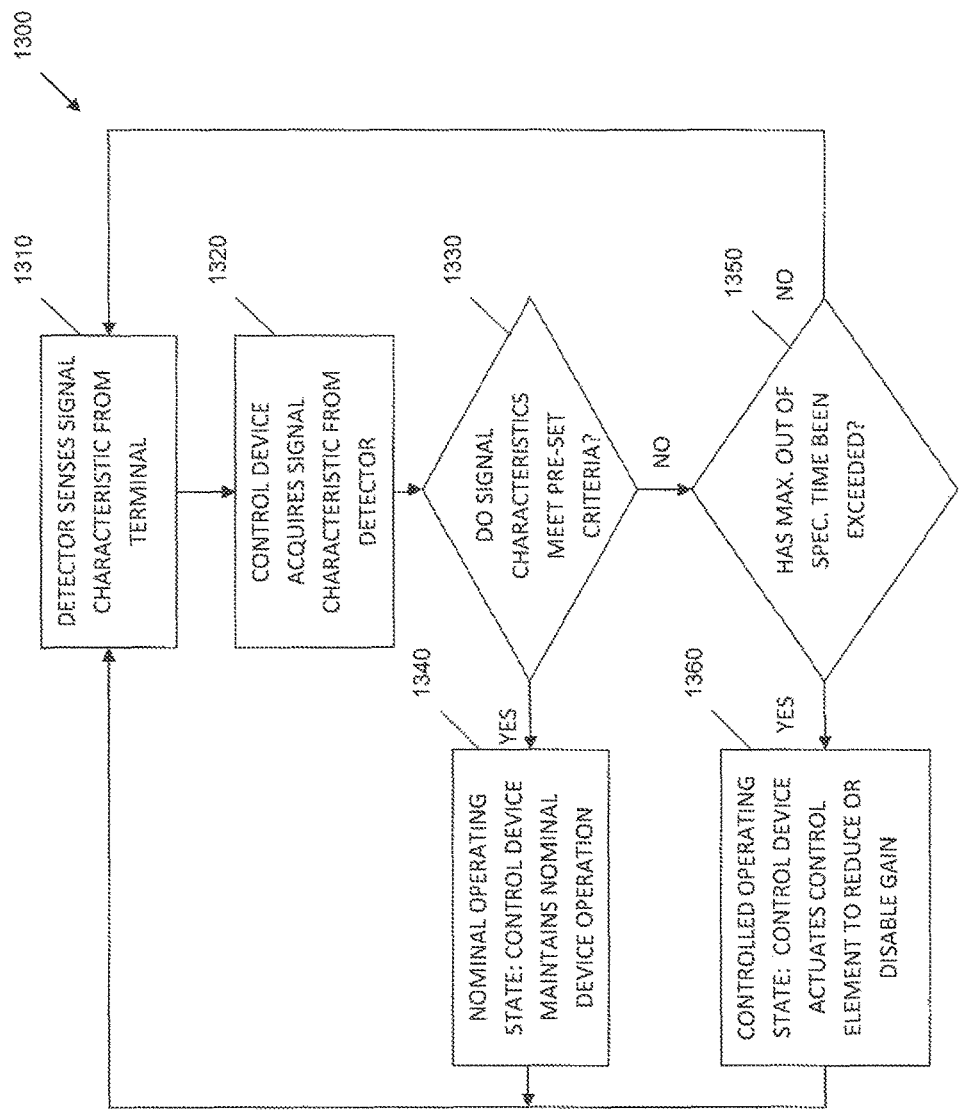
FIG. 13 is a flowchart of a method for controlling the operating state of a microwave transistor device, in accordance with an example embodiment.

FIG. 13 is a flowchart of a method 1300 for controlling the operating state of a microwave transistor device (e.g., devices 100, 1100, 1200), in accordance with an example embodiment. As shown, in a step 1310, the method includes a detector (e.g., detector 160, 1160, 1260) sensing signal characteristics from a terminal of the microwave transistor device, according to an embodiment. In an embodiment, signal characteristics sensed by the detector may include one or more of an average power level, peak power level, or other relevant signal characteristic(s). In a step 1320, the method further includes acquiring signal characteristic(s) from the detector using a control device (e.g., control device 174, 1174, 1274), where the signal characteristics may include extra-band power, in-band power, low-side out-of-band power, and/or high-side out-of-band power. In a decision step 1330, the method further involves determining whether the signal characteristics of step 1320 meet pre-set criteria using the control device. If the pre-set criteria is satisfied (e.g., the maximum allowable out-of-band signal power level has not been exceeded), then the control device allows device operation to continue without altering the state of microwave transistor device in accordance with step 1340. More particularly, the microwave transistor device remains in a nominal operating state (e.g., states 600 and 900 of FIGS. 6 and 9 as described above), in an embodiment of the method. In an embodiment of the method, if the pre-set criteria is not satisfied (e.g., a maximum allowable out-of-band signal power level has been exceeded), then the control device executes a decision step 1350 for determining whether the pre-set criteria for signal characteristics has not been met for a pre-determined length of time (e.g., the device has been in a controlled operational state for the pre-determined length of time, or the maximum out of spec time has been exceeded). In an embodiment of the method, if the pre-set criteria for signal characteristics have not been met for a period of time that is less than the pre-determined length of time, in a step 1360, the method involves causing the control device to place the microwave transistor device in the controlled state of operation by actuating a control element (e.g., control element 172, 1172, 1272) to either reduce or disable the gain of the control device. This has the effect of either reducing or eliminating the electrical coupling between one of the input or output terminals and the active transistor die (e.g., states 700 and 1000 of FIGS. 7 and 10 as described above). In an embodiment of the method, the pre-determined length of time may be between about 1 millisecond and about 100 seconds, although other suitable times may be used. In an embodiment, if the pre-set criteria for signal characteristics have not been met for a period of time that exceeds the pre-determined length of time, as determined in step 1360, the control device discontinues altering the state of the control element, thus re-entering the nominal operating state of the microwave transistor device. At that point, the microwave transistor device executes step 1310 of the method as described above.

Various embodiments of a device have been disclosed. An embodiment of the device may include a terminal, an active transistor die coupled to a package and electrically coupled to the terminal, a detector coupled to the package and electrically coupled to the terminal, and control circuitry coupled to the package and electrically coupled to the active transistor die and to the detector. In an embodiment, the detector may be configured to sense a signal characteristic on the terminal. According to an embodiment, the control circuitry may be configured to acquire the signal characteristic from the detector, and based on the signal characteristic, to control in which of multiple operating states the device operates. In an embodiment, the signal characteristic may include one or more characteristics selected from voltage, current, charge, frequency, power level, average power, peak power, peak power to average power ratio, linearity, noise power, and phase. In an embodiment, the detector may include one or more power detection circuits and one or more filters electrically coupled to the one or more power detection circuits, wherein the one or more filters are configured to allow sensing the average power in one or more in-band frequency ranges and one or more out-of-band frequency ranges. In an embodiment, the detector may include a band-pass bulk acoustic wave filter coupled to the power detection circuit to sense the average power level in in-band frequency ranges. In an embodiment, the terminal includes one or more terminals selected from an input terminal and an output terminal. In an embodiment, the control circuitry may include a control element, coupled to the package and electrically coupled to the active transistor die, and a control device coupled to the package. In an embodiment, the control circuitry may be electrically coupled to the detector and to the control element. In an embodiment, the control device may be configured to acquire the signal characteristic from the detector, and based on the signal characteristic, to cause the control element to control in which of the multiple operating states the microwave transistor device operates. In one of the multiple operating states, the control element may be configured to reduce electrical coupling between the active transistor die and the terminal when the control device becomes inactive or otherwise loses electrical coupling between the control device and control element, according to an embodiment. In an embodiment, the control element may include one or more elements selected from a variable gain stage, a switch element, or a tuning element. In an embodiment, the control circuitry may be configured to acquire, from the detector, a power level sensed in one or more in-band frequency ranges and to acquire, from the detector, a second signal characteristic sensed in one or more out-of-band frequency ranges. In an embodiment, the control circuitry may be configured to reduce the power level in at least one of the one or more out-of-band frequency ranges if the power level in at least one of the one or more out-of-band frequency ranges exceeds a pre-determined level for a pre-determined period of time.

Another embodiment of the inventive subject matter includes a microwave transistor device that include a package that includes an input terminal and an output terminal, an active transistor die coupled to the package and electrically coupled to the input terminal and the output terminal, a detector coupled to the package and electrically coupled to at least one of the input terminal and the output terminal, a control device coupled to the package and electrically coupled to the detector, and a control element that includes an active variable gain stage, wherein the control element is coupled to the package and electrically coupled to the input terminal, the active transistor die, and the control device. In an embodiment, the detector may be configured to sense power levels in an in-band frequency range. In an embodiment, the control device may include a microcontroller. In an embodiment, the control device may be configured to acquire the power levels in the in-band frequency range from the detector. In an embodiment, the control device may be further configured to reduce a gain applied by the control element. In an embodiment, the microwave transistor device may include a coupler that electrically couples one of the input terminal and output terminal to the detector. In an embodiment, the detector may include two or more power detection circuits, wherein a first power detection circuit is electrically coupled to a bandpass filter. In an embodiment, the bandpass filter may include a bulk acoustic wave filter. In an embodiment, the detector may be further configured to sense one or more power levels in one or more out-of-band frequency ranges. In an embodiment, the control device may be further configured to acquire one or more power levels in one or more out-of-band frequency ranges from the detector. In an embodiment, the control device may be further configured to reduce a gain applied by the control element to reduce one or more power levels in one or more out-of-band frequency ranges.

Another embodiment of the inventive subject matter includes a method of controlling an operating state of a device that includes a package, a terminal coupled to the package, and an active transistor die coupled to the package. In an embodiment, the method may include the steps of sensing, using a detector electrically coupled to the terminal and coupled to the package, a signal characteristic at the terminal, acquiring, using a control device electrically coupled to the detector and coupled to the package, the signal characteristic, and determining, using the control device, whether the signal characteristic conforms to a pre-set criteria, and when the signal characteristic does not conform to the pre-set criteria, modifying, using the control device, a state of a control element electrically coupled to the active transistor die to alter the operating state of the device. In an embodiment of the method, sensing the signal characteristic may include sensing a power level at the terminal. In an embodiment, the method may include determining whether the signal characteristic conforms to the pre-set criteria. In an embodiment, the method may include comparing an average input power to the device at the terminal in the in-band frequency range to an average input power at the terminal in the one or more out-of-band frequency ranges. In an embodiment of the method, the control element is configured as a variable gain stage, and modifying the state of the control element may include reducing a gain of the variable gain stage when the power level in one or more or a combination of the out-of-band frequency range(s) exceeds a pre-determined value. In an embodiment of the method, the control device may be configured as a switch, and modifying the state of the control element may include actuating the switch to substantially reduce electrical coupling between the input terminal and the active transistor die when the power level in one or more or the combination of the out-of-band frequency ranges exceeds the pre-determined value. In an embodiment, the method may include causing the control element to reduce a gain applied by the device to a pre-determined level when the control device is not active or otherwise in electrical communication with the control element.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. For example, in other embodiments, microwave transistor device 100 may be configured to restrict other signal characteristics such as voltage, current, charge, average power, peak power, peak power to average power ratio, linearity, noise power, signal phase, or other relevant electrical characteristics. In these and other embodiments, signal characteristics including voltage, current, charge, average power, peak power, peak power to average power ratio, linearity, noise power, signal phase, or other relevant electrical characteristics may be detected by microwave transistor device 100 and may be used to cause restrictions of these or other electrical characteristics. These alternate embodiments may include modified versions of detectors 160 and 1160 of FIGS. 1, 2, 8, and 11 and/or control devices 174 and 1174 of FIGS. 1 and 11 that have been adapted to detect the relevant quantities. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
    a package that includes a terminal;
    an active transistor die coupled to the package and electrically coupled to the terminal;
    a detector, coupled to the package and electrically coupled to the terminal, and configured to sense a signal characteristic on the terminal; and
    control circuitry, coupled to the package and electrically coupled to the active transistor die and to the detector, wherein the control circuitry comprises a control device that includes a temperature sensor coupled to the package and is configured to acquire the signal characteristic from the detector, detect a package temperature, and based on the signal characteristic and the package temperature, to control in which of multiple operating states the device operates.

2. The device of claim 1, wherein the signal characteristic includes one or more characteristics selected from voltage, current, charge, frequency, power level, average power, peak power, peak power to average power ratio, linearity, noise power, and phase.

3. The device of claim 2, wherein the detector further comprises:
one or more power detection circuits; and
one or more filters electrically coupled to the one or more power detection circuits, wherein the one or more filters are configured to allow sensing the average power in one or more in-band frequency ranges and one or more out-of-band frequency ranges.

4. The device of claim 2, wherein the control circuitry is further configured to acquire, from the detector, a power level sensed in one or more in-band frequency ranges and to acquire, from the detector, a second signal characteristic sensed in one or more out-of-band frequency ranges.

5. The device of claim 1, wherein the terminal includes one or more terminals selected from an input terminal and an output terminal.

6. The device of claim 1, wherein the control circuitry further comprises a control element, coupled to the package and electrically coupled to the active transistor die.

7. The device of claim 6, wherein, in one of the multiple operating states, the control element is configured to reduce electrical coupling between the active transistor die and the terminal when the control device becomes inactive or otherwise loses electrical coupling between the control device and control element.

8. The device of claim 6, wherein the control element comprises one or more elements selected from a variable gain stage, a switch element, or a tuning element.

9. The device of claim 6, wherein the control circuitry further comprises a variable gain stage and is configured to reduce a transducer gain of a primary signal path of the device when the package temperature exceeds a pre-determined level.

10. The device of claim 6, wherein the control circuitry further comprises a variable gain stage and is configured to maintain a transducer gain of a primary signal path of the device independent of the package temperature.

11. A microwave transistor device comprising:
a package that includes an input terminal and an output terminal;
an active transistor die coupled to the package and electrically coupled to the input terminal and the output terminal;
a detector, wherein the detector is coupled to the package and electrically coupled to at least one of the input terminal or the output terminal, and the detector is configured to sense power levels in at least one of an in-band frequency range or an out of band frequency range;
a control device comprising a microcontroller, wherein the control device is coupled to the package and electrically coupled to the detector, includes a temperature sensor coupled to the package, and is configured to acquire the power levels in the in-band frequency range from the detector and measure the package temperature; and
a control element comprising an active variable gain stage, wherein the control element is coupled to the package and electrically coupled to the input terminal, the active transistor die, and the control device, and wherein the control device is further configured to vary a gain applied by the control element.

12. The microwave transistor device of claim 11 further comprising a coupler that electrically couples one of the input terminal and output terminal to the detector.

13. The microwave transistor device of claim 11 wherein the detector comprises two or more power detection circuits, wherein a first power detection circuit is electrically coupled to a bandpass filter.

14. The microwave transistor device of claim 11 wherein the detector is further configured to sense one or more power levels in one or more out-of-band frequency ranges.

15. The microwave transistor device of claim 11 wherein the control device is further configured to maintain a transducer gain of a primary signal path of the device independent of the package temperature.

16. The microwave transistor device of claim 11 wherein the control device is further configured to reduce a gain applied by the control element to reduce one or more power levels in one or more out-of-band frequency ranges.

17. A method of controlling an operating state of a device that includes a package, a terminal coupled to the package, and an active transistor die coupled to the package, the method comprising the steps of:
sensing, using a detector electrically coupled to the terminal and coupled to the package, a signal characteristic at the terminal; acquiring, using a control device electrically coupled to the detector and coupled to the package, the signal characteristic;
detecting, using a temperature sensor included in the control device and coupled to the package, a package temperature;
determining, using the control device, whether at least one of the signal characteristic or the package temperature conforms to pre-set criteria; and
when at least one of the signal characteristic or the package temperature does not conform to the pre-set criteria, modifying, using the control device, a state of a control element electrically coupled to the active transistor die to alter the operating state of the device.

18. The method of claim 17, wherein sensing the signal characteristic comprises sensing a power level at the terminal.

19. The method of claim 17, wherein determining whether the signal characteristic conforms to the pre-set criteria comprises comparing an average input power to the device at the terminal in the in-band frequency range to an average input power at the terminal in the one or more out-of-band frequency ranges.

20. The method of claim 17, wherein the control element is configured as a variable gain stage, and modifying the state of the control element comprises reducing a gain of the variable gain stage when the power level in one or more or a combination of the out-of-band frequency range(s) exceeds a pre-determined value.

21. The method of claim 17, wherein the control element is configured as a variable gain stage, and modifying the state of the control element comprises reducing a gain of the variable gain stage when the package temperature exceeds a pre-determined value.

22. The method of claim 17, wherein the control element is configured as a variable gain stage, and modifying the state of the control element comprises varying a gain of the variable gain stage to maintain a constant value of a transducer gain of a primary signal path of the device independent of the package temperature.

23. The method of claim 17, further comprising estimating a transistor die temperature, by the control device, using the package temperature, the thermal resistance of the transistor die, and the estimate of the power level at the terminal.

\* \* \* \* \*